US012796404B2

(12) United States Patent
Zhang et al.

(10) Patent No.: US 12,796,404 B2
(45) Date of Patent: Nov. 10, 2026

(54) MACHINE-LEARNING IN MULTI-STEP SEMICONDUCTOR FABRICATION PROCESSES

(71) Applicant: Lam Research Corporation, Fremont, CA (US)

(72) Inventors: Yan Zhang, Fremont, CA (US); Ye Feng, Portland, OR (US); Dipongkar Talukder, Sherwood, OR (US); Jeffrey D. Bonde, Redwood City, CA (US); Weng Foong Woo, Portland, OR (US); Karthik Thimmavajjula, Happy Valley, OR (US); Jorge Luque, Redwood City, CA (US)

(73) Assignee: Lam Research Corporation, Fremont, CA (US)

( * ) Notice: Subject to any disclaimer, the term of this patent is extended or adjusted under 35 U.S.C. 154(b) by 638 days.

(21) Appl. No.: 18/256,665

(22) PCT Filed: Dec. 14, 2021

(86) PCT No.: PCT/US2021/063222
§ 371 (c)(1),
(2) Date: Jun. 9, 2023

(87) PCT Pub. No.: WO2022/132704
PCT Pub. Date: Jun. 23, 2022

(65) Prior Publication Data

US 2024/0096713 A1 Mar. 21, 2024

Related U.S. Application Data

(60) Provisional application No. 63/260,532, filed on Aug. 24, 2021, provisional application No. 63/201,642, (Continued)

(51) Int. Cl.
*H10P 74/00* (2026.01)
*G06N 20/00* (2019.01)
*H10P 72/00* (2026.01)

(52) U.S. Cl.
CPC ............ *H10P 74/23* (2026.01); *G06N 20/00* (2019.01); *H10P 72/0604* (2026.01)

(58) Field of Classification Search
CPC ...... H10P 74/23; H10P 72/0604; G06N 20/00

(Continued)

(56) References Cited

U.S. PATENT DOCUMENTS 6,132,289 A 10/2000 Labunsky et al.
6,788,988 B1 9/2004 Pasadyn et al.

(Continued)

FOREIGN PATENT DOCUMENTS

CN 111971551 A 11/2020
JP 2005536074 A 11/2005

(Continued)

OTHER PUBLICATIONS

Hopper, et al., "Improved Infrared Imaging of Semiconductor Devices" Microscopy: advances in scientific research and education (A. Mendez-Vilas, Ed.) Formatex 2014, pp. 697-702.

(Continued)

*Primary Examiner* — Md Azad
(74) *Attorney, Agent, or Firm* — Weaver Austin Villeneuve & Sampson LLP

(57) ABSTRACT

Methods and systems for using a time-series of spectra to identify endpoint of a multi-step semiconductor fabrication processes such as multi-step deposition and multi-step etch processes. One method includes accessing a virtual carpet (e.g., a machine learning model) that is formed from a time-series of spectra for the multi-step processes collected during a training operation. During production, in-situ time- (Continued)

series of spectra are compared to the virtual carpet as part of end pointing of multi-step fabrication processes.

28 Claims, 12 Drawing Sheets

Related U.S. Application Data filed on May 6, 2021, provisional application No. 63/199,237, filed on Dec. 15, 2020.

(58) Field of Classification Search
USPC .......................................................... 700/121
See application file for complete search history.

(56) References Cited

U.S. PATENT DOCUMENTS

| | | | | |
|---|---|---|---|---|
| 7,018,855 | B2 | 3/2006 | Kota et al. | |
| 7,595,869 | B1 | 9/2009 | Tian et al. | |
| 7,894,927 | B2 | 2/2011 | Funk et al. | |
| 8,852,964 | B2 | 10/2014 | Kimura et al. | |
| 9,245,761 | B2 | 1/2016 | Singh et al. | |
| 9,752,981 | B2 | 9/2017 | Lee et al. | |
| 10,032,681 | B2 | 7/2018 | Bailey, III et al. | |
| 10,262,910 | B2 | 4/2019 | Feng et al. | |
| 10,303,830 | B2 | 5/2019 | Tetiker et al. | |
| 10,658,222 | B2 | 5/2020 | Yan et al. | |
| 11,353,364 | B2 | 6/2022 | Thompson | |
| 12,360,510 | B2 | 7/2025 | Feng et al. | |
| 2003/0097198 | A1 | 5/2003 | Sonderman et al. | |
| 2005/0136346 | A1 | 6/2005 | Ottens et al. | |
| 2006/0247816 | A1 | 11/2006 | Prager et al. | |
| 2008/0078948 | A1 | 4/2008 | Saito | |
| 2009/0083013 | A1 | 3/2009 | Li et al. | |
| 2009/0242513 | A1* | 10/2009 | Funk | H10P 74/203 700/110 |
| 2011/0249115 | A1 | 10/2011 | Genest et al. | |
| 2012/0253497 | A1 | 10/2012 | Prager et al. | |
| 2013/0114088 | A1 | 5/2013 | Newman | |
| 2014/0302681 | A1 | 10/2014 | Paterson et al. | |
| 2015/0356233 | A1* | 12/2015 | Fouquet | G03F 7/705 716/112 |
| 2016/0211166 | A1 | 7/2016 | Yan et al. | |
| 2016/0248994 | A1 | 8/2016 | Liu | |
| 2017/0109646 | A1 | 4/2017 | David | |
| 2017/0133202 | A1 | 5/2017 | Berry, III | |
| 2018/0108578 | A1* | 4/2018 | Pandev | H10P 74/203 |
| 2018/0150052 | A1 | 5/2018 | Cherian | |
| 2018/0182632 | A1* | 6/2018 | Feng | H10P 74/238 |
| 2019/0049937 | A1 | 2/2019 | Tetiker et al. | |
| 2019/0072482 | A1 | 3/2019 | Feng et al. | |
| 2019/0244870 | A1* | 8/2019 | Feng | H10P 74/238 |
| 2019/0311083 | A1 | 10/2019 | Feng et al. | |
| 2019/0362991 | A1 | 11/2019 | Mungekar et al. | |
| 2020/0110390 | A1 | 4/2020 | Banna | |
| 2020/0243359 | A1 | 7/2020 | Hao et al. | |
| 2020/0279066 | A1 | 9/2020 | Banna et al. | |
| 2021/0035833 | A1 | 2/2021 | Feng et al. | |
| 2021/0150116 | A1* | 5/2021 | Fan | G03F 7/705 |
| 2021/0270673 | A1 | 9/2021 | Thompson | |
| 2021/0374936 | A1* | 12/2021 | Koopman | G06F 18/2431 |
| 2022/0334554 | A1 | 10/2022 | Feng et al. | |
| 2024/0047248 | A1 | 2/2024 | Talukder et al. | |
| 2024/0255858 | A1 | 8/2024 | Feng et al. | |
| 2025/0298392 | A1 | 9/2025 | Feng et al. | |

FOREIGN PATENT DOCUMENTS

| | | | |
|---|---|---|---|
| JP | 2008091673 | A | 4/2008 |
| JP | 2012186394 | A | 9/2012 |
| JP | 2020004817 | A | 1/2020 |
| KR | 101460375 | B1 | 11/2014 |
| KR | 102033136 | B1 | 10/2019 |
| TW | 201838053 | A | 10/2018 |
| WO | WO-2004015364 | A1 | 2/2004 |
| WO | WO-2015027088 | A1 | 2/2015 |
| WO | WO-2016190905 | A1 | 12/2016 |
| WO | WO-2019195481 | A1 | 10/2019 |
| WO | WO-2020154708 | A1 | 7/2020 |
| WO | WO-2021202171 | A1 | 10/2021 |

OTHER PUBLICATIONS

International Search Report and Written Opinion dated Apr. 11, 2022, in Application No. PCT/US2021/063222.

International Search Report and Written Opinion dated Sep. 15, 2022 in Application No. PCT/US2022/030527.

International Preliminary Report on Patentability dated Feb. 17, 2022 in PCT Application No. PCT/US2020/070384.

International Preliminary Report on Patentability dated Jun. 29, 2023, in Application No. PCT/US2021/063055.

International Preliminary Report on Patentability dated Jun. 29, 2023, in Application No. PCT/US2021/063222.

International Search Report and Written Opinion dated Apr. 8, 2022, for International Application No. PCT/US2021/063055.

International Search Report and Written Opinion dated Nov. 17, 2020 issued in Application No. PCT/US2020/070384.

JP Office Action dated Oct. 18, 2022, in Application No. 2021-152896 with English translation.

Kota, et al., "Advanced process control for polysilicon gate etching using integrated optical CD metrology," Proc. SPIE 5044, Advanced Process Control and Automation, Jul. 1, 2003, pp. 1-8. doi:10.1117/12.487635.

KR Office Action dated Apr. 15, 2022, in application No. KR1020170026906 with English Translation.

KR Office Action dated Oct. 22, 2021, in application No. KR10-2017-0026906 with English Translation.

NOVA Process Insights [Webpage] "Machine Learning" (2019) pp. 1-3. https://www.novami.com/nova-technology/machine-learning/ [retrieved on Jun. 5, 2019].

Stewart, M. et al., "Comprehensive Introduction to Autoencoders", Apr. 14, 2019, 24 Pages. downloaded Mar. 25, 2020 from the internet at https://towardsdatascience .com/generating-images-with-autoencoders-77fd3a8dd368.

U.S. Non Final Office Action dated Sep. 17, 2021 in U.S. Appl. No. 17/249,317.

U.S. Notice of Allowance dated Feb. 9, 2022 in U.S. Appl. No. 17/249,317.

U.S. Appl. No. 18/258,497, inventors Talukder D, et al., filed Jun. 20, 2023.

Cullen C.W., et al., "Temperature Measurement of Metal-Coated Silicon Wafers by Double-Pass Infrared Transmission," IEEE Transactions on Semiconductor Manufacturing, 1995, vol. 8 (3), pp. 346-351.

International Preliminary Reporton Patentability and Written Opinion dated Dec. 14, 2023 in PCT Application No. PCT/US2022/030527.

Iuchi T., et al., "A Non-Contact Temperature Measurement of Semitransparent Silicon Wafers with Absorption Edge Wavelength," International Conference on Control, Automation and Systems, 2008, pp. 941-945.

KR Office Action dated Dec. 29, 2022 in Application No. KR10-2022-0086361 with English translation.

Lam Research Corporation, Previous Deployment Description, Machine Learning Models for Process Control, prior to Sep. 2018 (1 page).

Sturm J.C., et al., "Silicon Temperature Measurement by Infrared Absorption: Fundamental Processes and Doping Effects," IEEE Transactions on Electron Devices, 1992, vol. 39 (1), pp. 81-88.

TW Office Action and Search Report dated Aug. 22, 2025 in TW Application No. 110146532, with English Translation.

TW Office Action and Search Report dated May 29, 2025 in TW Application No. 110147657, with English Translation.

TW Office Action dated Mar. 31, 2026 in TW Application No. 110147657, with English Translation.

U.S. Non-Final Office Action dated Apr. 29, 2026 in U.S. Appl. No. 18/258,497.

(56) References Cited

OTHER PUBLICATIONS

U.S. Notice of Allowance dated Mar. 10, 2025 in U.S. Appl. No. 17/659,458.

* cited by examiner

230

Real Frame Samples 231 232

| Frame # | Time |
|---|---|
| Frame 0 | t0 |
| Frame 1 | t1 |
| Frame 2 | t2 |
| Frame 3 | t3 |
| ⋮ | ⋮ |
| **Frame 467** | Tn |

Measured etch depth or other parameter

720

Virtual Frame Samples 721 722

| Virtual Frame # (VF#) | Time |
|---|---|
| Virtual Frame 0 | t0 |
| Virtual Frame 1 | t1 |
| Virtual Frame 2 | t2 |
| Virtual Frame 3 | t3 |
| ⋮ | ⋮ |
| **Virtual Frame 300** | tn |

MACHINE-LEARNING IN MULTI-STEP SEMICONDUCTOR FABRICATION PROCESSES

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

Smaller technology nodes and more complex device designs naturally introduce variations in electronic device characteristics between wafers. Without compensation, advanced etch and deposition processes routinely produce wafer to wafer (W2W) variations. For example, the critical dimension (CD), etch depth, etc. of an etched and/or deposited feature may vary from wafer to another. While metrology can identify non-uniformities and thereby allow process engineers to modify processing operations during production, the time spent identifying problems and determining appropriate corrections requires additional time and resources.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

In one aspect, a method of generating a machine learning model configured to predict a substrate parameter value on a substrate during or after processing the substrate in a process chamber is provided, where the method includes receiving training data including, for each of a plurality of training substrates, (a) time varying spectral data collected in situ from a training substrate over multiple steps of a multi-step etch process performed on the training substrate, and (b) a parameter value characterizing at least one physical property of the training substrate, where the physical property was modified by the multi-step etch process and wherein the multi-step etch processes included at least two non-contiguous etching or deposition steps; extracting features from the time varying spectral data to provide a separate virtual representation of the time varying spectral data for each of the training substrates; and generating the machine learning model by using, for each of the plurality of training substrates, the virtual representation of the time varying spectral data and the parameter value characterizing at least one physical property of the training substrate, where the machine learning model is configured to predict the substrate parameter value of a test substrate subjected to the multi-step etch process using, as inputs, the time varying spectral data collected in situ from the test substrate.

In another aspect, the method also includes, changing, based on the machine learning model and the time varying spectral data collected in situ from the test substrate, a duration of an intermediate step of the multi-step etch process. In another aspect, the time varying spectral data includes at least two types of spectra collected in situ from the training wafers. In another aspect, the time varying spectral data includes reflectance spectra collected in situ from the training wafers. In another aspect, the time varying spectral data includes emission spectra collected in situ from the training wafers. In another aspect, extracting features from the time varying spectral data includes fitting the time varying spectral data with a polynomial. In another aspect, the multi-step etch process is an atomic layer etch process. In another aspect, the multi-step etch process is a plasma etching process having at least two non-contiguous etching steps. In another aspect, the parameter value characterizing at least one physical property of the training substrate is an etch depth. In another aspect, the parameter value characterizing at least one physical property of the training substrate is a critical dimension. In another aspect, the parameter value characterizing at least one physical property of the training substrate is a sidewall angle. In another aspect, the parameter value characterizing at least one physical property of the training substrate is an overlay. In another aspect, the parameter value characterizing at least one physical property of the training substrate is a critical dimension of recessed features on the substrate.

In certain embodiments, the training data further includes, for each of the plurality of training substrates, at least one feed forward parameter of a process chamber, and the operation of generating the machine learning model uses the at least one feed forward parameter. In some embodiments, the at least one feed forward parameter is a temperature in the process chamber, a plasma condition in the process chamber, a pressure in the process chamber, a flow rate in the process chamber, a time duration of one or more process steps, or a design and/or configuration of a component in the process chamber. In some embodiments, the at least one feed forward parameter is from (a) a current step of the multi-step etch process or the multi-step deposition process, (b) a previous step prior to the current step of the multi-step etch process or the multi-step deposition process, or (c) a subsequent condition after completion of the current step of the multi-step etch process or the multi-step deposition process.

In another aspect, a method of generating a machine learning model configured to predict a plurality of substrate parameter values on a substrate during or after processing the substrate in a process chamber is provided, where the method includes receiving training data comprising, for each of a plurality of training substrates, (a) time varying spectral data collected in situ from a training substrate over multiple steps of a multi-step etch process performed on the training substrate, and (b) a plurality of parameter values characterizing a plurality of physical properties of the training substrate, where each of the physical properties is modified by the multi-step etch process; extracting features from the time varying spectral data to provide a separate virtual representation of the time varying spectral data for each of the training substrates; and generating the machine learning model by using, for each of the plurality of training substrates, the virtual representation of the time varying spectral data and the plurality of parameter values characterizing the plurality of physical properties of the training substrate, where the machine learning model is configured to predict the plurality of substrate parameter values of a test substrate subjected to the multi-step etch process using, as inputs, the time varying spectral data collected in situ from the test substrate.

In another aspect, the multi-step etch processes included at least two non-contiguous etching steps. In another aspect, the multi-step etch processes included at least two contiguous etching steps.

In another aspect, a method of controlling a multi-step etch process conducted on a substrate is provided, where the method includes (a) receiving time varying spectral information collected in situ, while the substrate is being etched over multiple steps of the etch process conducted in a process chamber; (b) extracting features from the time varying spectral data of the substrate to provide a virtual representation of the time varying spectral data; (c) processing the extracted virtual representation using a machine learning model trained using virtual representations of a plurality of training substrates; and (d) controlling and/or adjusting a process condition in the process chamber by using an output of the machine learning model.

In another aspect, the controlling and/or adjusting the process condition includes controlling or adjusting a length of time during a final step of the multi-step etch process. In another aspect, the controlling and/or adjusting the process condition includes controlling or adjusting a length of time during an intermediate step of the multi-step etch process, the intermediate step preceding a final step of the multi-step etch process.

In another aspect, controlling and/or adjusting the process condition includes controlling or adjusting temperature (e.g., wafer support temperature), chamber pressure, plasma parameters (e.g., plasma power, frequency, pulse characteristics, etc.), and/or time duration of a process or one or more steps of a process.

In some embodiments, the machine learning model processes not only features from time varying spectral information but also “feed forward” information about the process chamber in which the substrate is currently being processed, an upstream process chamber, or a downstream process chamber. Examples of feed forward information include the temperature of one or more components in a process chamber, the plasma conditions (e.g., plasma power, frequency, voltage, current, and/or pulse characteristics) in a process chamber, the pressure in a process chamber, flow rate at one or more locations in a process chamber, and the design and/or configuration characteristics about one or more components of a process chamber.

In another aspect, a method of controlling a multi-step deposition process conducted on a substrate is provided, where the method includes (a) receiving time varying spectral information collected in situ, while material is deposited onto the substrate over multiple steps of the deposition process conducted in a process chamber; (b) extracting features from the time varying spectral data of the substrate to provide a virtual representation of the time varying spectral data; (c) processing the extracted virtual representation using a machine learning model trained using virtual representations of a plurality of training substrates; and (d) controlling and/or adjusting a process condition in the process chamber by using an output of the machine learning model.

In another aspect, the controlling and/or adjusting the process condition includes controlling or adjusting a length of time during a final step of the multi-step deposition process. In another aspect, the controlling and/or adjusting the process condition includes controlling or adjusting a length of time during an intermediate step of the multi-step deposition process, the intermediate step preceding a final step of the multi-step deposition process.

In another aspect, an apparatus includes a process chamber configured to hold a substrate and perform a multi-step etch process or a multi-step deposition process on the substrate; at least one metrology module configured to generate spectral data at a plurality of time points in situ from the substrate over multiple steps of the multi-step etch or the deposition process performed on the substrate; and a control system. In some implementations, the control system is configured to (a) receive spectral data collected in situ using the at least one metrology module, while material is deposited onto the substrate over multiple steps of the multi-step deposition process or while material is removed from the substrate over multiple steps of the multi-step etch process; (b) extract features from the spectral data of the substrate to provide a virtual representation of the spectral data; (c) process the virtual representation using a machine learning model trained using virtual representations of a plurality of training substrates; and (d) controlling and/or adjusting a process condition associated with the multi-step etch process or the multi-step deposition process in the process chamber by using an output of the machine learning model.

In some embodiments, the control system is configured to control or adjust a length of time during a final step of the multi-step deposition process or of the multi-step etch process. In some embodiments, the control system is configured to control and/or adjust a length of time during an intermediate step of the multi-step deposition process or of the multi-step etch process, the intermediate step preceding a final step of the multi-step deposition process or the multi-step etch process.

In some embodiments, the control system is further configured to receive at least one feed forward parameter and process the at least one feed forward parameter, along with the virtual representation, using the machine learning model. In some embodiments, the at least one feed forward parameter is selected from the group consisting of a temperature in the process chamber, a plasma condition in the process chamber, a pressure in the process chamber, a flow rate in the process chamber, a time duration of one or more process steps, and a design and/or configuration of a component in the process chamber. In some embodiments, the at least one feed forward parameter is selected from the group consisting of a parameter from (a) a current step of the multi-step etch process or the multi-step deposition process, (b) a previous step prior to the current step of the multi-step etch process or the multi-step deposition process, or (c) a subsequent condition after completion of the current step of the multi-step etch process or the multi-step deposition process.

Certain aspects of this disclosure pertain to methods of performing metrology on a substrate undergoing a multi-step etch process or a multi-step deposition process. Such methods may be characterized by the following operations: (a) receiving spectral data collected in situ, while material is deposited onto or etched from the substrate over multiple steps of the deposition process or over multiple steps of the etch process conducted in a process chamber; (b) extracting features from the spectral data of the substrate to provide a virtual representation of the spectral data; (c) processing the virtual representation using a machine learning model trained using metrology data of a plurality of training substrates; and (d) providing in situ metrology values of the substrate using an output of the machine learning model.

Certain aspects of this disclosure pertain to apparatus comprising: (i) a process chamber configured to hold a substrate and perform a multi-step etch process or a multi-step deposition process on the substrate; (ii) at least one sensor configured to generate spectral data at a plurality of time points in situ from the substrate over multiple steps of the multi-step etch or the deposition process performed on the substrate; and (iii) a metrology module. In some embodiments, the metrology module is configured to: (a) receive spectral data collected in situ using the at least one metrology module, while material is deposited onto the substrate over multiple steps of the multi-step deposition process or while material is removed from the substrate over multiple steps of the multi-step etch process; (b) extract features from the spectral data of the substrate to provide a virtual representation of the spectral data; (c) process the virtual representation using a machine learning model trained using metrology data of a plurality of training substrates; and (d) provide in situ metrology values of the substrate using an output of the machine learning model.

Unless otherwise stated herein, all processes and apparatus described herein may be employed in either or both subtraction processes (e.g., etch) and addition processes (e.g., deposition). Also, all processes and apparatus described herein may be employed in multistep processes such as atomic layer deposition and atomic layer etch.

DETAILED DESCRIPTION

Figure 1:
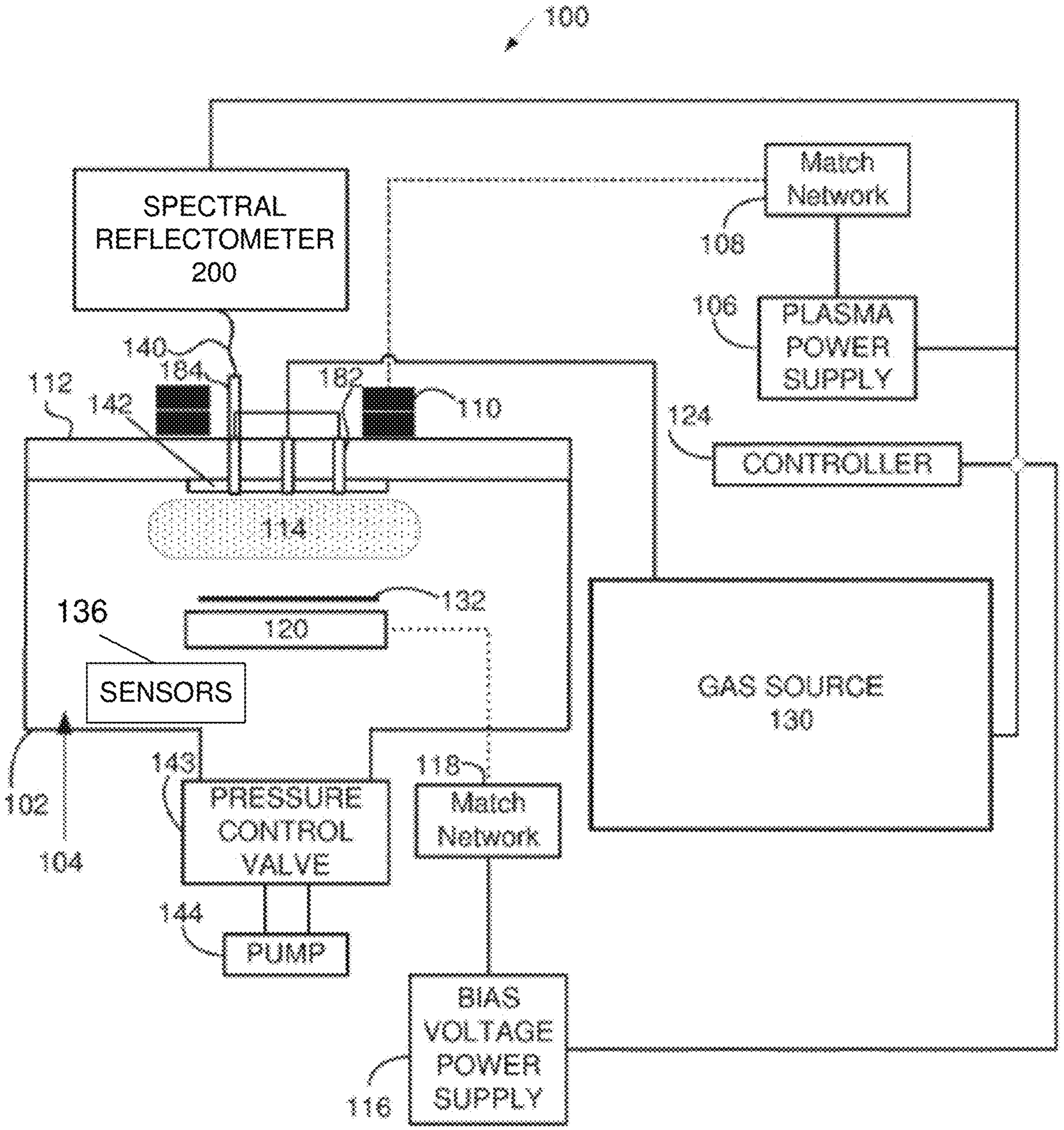
FIG. 1 schematically illustrates an example of a fabrication tool in accordance with certain disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Terminology

The following terms are used throughout the instant specification:

The terms "semiconductor wafer," "wafer," "substrate," "wafer substrate" and "partially fabricated integrated circuit" may be used interchangeably. Those of ordinary skill in the art understand that the term "partially fabricated integrated circuit" can refer to a semiconductor wafer during any of many stages of integrated circuit fabrication thereon. A wafer or substrate used in the semiconductor device industry typically has a diameter of 200 mm, or 300 mm, or 450 mm. This detailed description assumes the embodiments are implemented on a wafer. However, the disclosure is not so limited. The work piece may be of various shapes, sizes, and materials. Besides semiconductor wafers, other work pieces that may take advantage of the disclosed embodiments include various articles such as printed circuit boards, magnetic recording media, magnetic recording sensors, mirrors, optical elements, micro-mechanical devices and the like.

A "semiconductor device fabrication operation" or "fabrication operation," as used herein, is an operation performed during fabrication of semiconductor devices. Typically, the overall fabrication process includes multiple semiconductor device fabrication operations, each performed in its own semiconductor fabrication tool such as a plasma reactor, an electroplating cell, a chemical mechanical planarization tool, a wet etch tool, and the like. Categories of semiconductor device fabrication operations include subtractive processes, such as etch processes and planarization processes, and material additive processes, such as deposition processes (e.g., physical vapor deposition, chemical vapor deposition, atomic layer deposition, electrochemical deposition, electroless deposition). In the context of etch processes, a substrate etch process includes processes that etch a mask layer or, more generally, processes that etch any layer of material previously deposited on and/or otherwise residing on a substrate surface. Such etch process may etch a stack of layers in the substrate.

"Manufacturing equipment" or "fabrication tool" refers to equipment in which a manufacturing process takes place. Manufacturing equipment may include a processing chamber in which the workpiece resides during processing. Typically, when in use, manufacturing equipment performs one or more semiconductor device fabrication operations. Examples of manufacturing equipment for semiconductor device fabrication include subtractive process reactors and additive process reactors. Examples of subtractive process reactors include dry etch reactors (e.g., chemical and/or physical etch reactors), wet etch reactors, and ashers. Examples of additive process reactors include chemical vapor deposition reactors, and atomic layer deposition reactors, physical vapor deposition reactors, and electroplating cells.

In various embodiments, a process reactor or other manufacturing equipment includes a tool for holding a substrate during processing. Such tool is often a pedestal or chuck, and these terms are sometimes used herein as a shorthand for referring to all types of substrate holding or supporting tools that are included in manufacturing equipment.

"Metrology data" as used herein refers to data produced, at least in part, by measuring features of a processed or partially processed substrate, such as a semiconductor wafer comprising partially fabricated integrated circuits. The measurement may be made before, during, or after performing a semiconductor device fabrication operation in a process chamber. In certain embodiments, metrology data is produced by a metrology system performing optical metrology (e.g., scatterometry, ellipsometry, interferometry, and/or reflectometry) on an etched substrate. In certain embodiments, the metrology data is produced by performing reflectometry, dome scatterometry, angle-resolved scatterometry, and/or ellipsometry on a processed or partially processed substrate.

Examples of types of optical metrology signals include values of optical intensity for light that has interacted with a substrate surface. Such light may be reflected (e.g., as by specular reflection), scattered, diffracted, refracted, etc. by the substrate surface. The optical intensity values may be provided as a function of location with respect to the substrate and/or incident light, light wavelength (e.g., for spectral data), light polarization state, and the like. Optical metrology signals contain information about substrate feature composition and/or geometry. Examples of geometry information include location, shape, and/or dimensions of features. Such information is often obtained from measured optical metrology signals by complicated computations such as widely used optical critical dimension (OCD) techniques. In some embodiments herein, a metrology system does not employ integrated computational processing capability for determining compositional and/or geometric information about the substrate features. Rather, such metrology systems may simply produce raw or minimally processed optical signals. For example, some such embodiments feed optical signals directly to one or more machine learning models that analyze the signals to determine processing parameters for a subsequent fabrication operation.

Additional examples of types of optical metrology signals include in-situ measurements of plasma density and gas concentrations (e.g., process gases, byproducts, and other gases that may be present in a process chamber). In one scenario, plasma power may be monitored by one or more voltage, current sensors (e.g., VI probes). In another scenario, plasma density, process gas concentration, and byproduct and other gas concentrations may be measured by one or more optical emission spectroscopy sensors (OES). OES sensors may measure emission spectra from plasma and/or gases present in a process chamber. If desired, a suitable sensor may be used in measuring absorption spectra of plasma and/or gases present in a process chamber.

As explained in more detail elsewhere herein, some metrology systems may employ relatively large beam spots that can capture information over a relatively large area of the wafer surface. As examples, the beam spot size may have a diameter of about 5 mm or larger, or about 10 mm or larger. Other metrology systems employ small beam spots, such as spot sizes of about 2 mm or smaller or about 500 μm or smaller.

In some embodiments, the metrology data includes "metadata" pertaining to a metrology system or conditions used in obtaining the metrology data. Metadata may be viewed as a set of labels that describe and/or characterizes the data. A non-exclusive list of metadata attributes includes:

Process Tools design and operation information such as preprocessing platform or tool design information, process recipe information, etc.

Detector capture details such as contrast, magnification, blur, noise, brightness, etc.

Wafers or other workpieces that have not have yet been processed in a process chamber or other manufacturing equipment under consideration may be referred to as "preprocessed" wafers. Wafers or other workpieces that were previously processed in a process chamber or other manufacturing equipment under consideration may be referred to "postprocessed" wafers. A preprocessed wafer becomes a postprocessed wafer by undergoing processing in a manufacturing equipment. In some embodiments, metrology information (including spatially distributed metrology information) obtained on preprocessed wafers is used to determine process control setting on the manufacturing equipment under consideration that will produce a target spatial distribution of structure parameter values (e.g., feature CD, pitch, and depth) on the surface of the resulting postprocessed wafer, which was previously the preprocessed wafer. In some embodiments, the preprocessed information includes information about an earlier process (or a an earlier stage in the current process) or a later process if the information is available at current stage such as process temperature, pressure, plasma conditions, etc. Choosing process settings based on a preprocessed wafer may be considered feed forward control of manufacturing equipment. Process settings of manufacturing equipment that may be adjusted based on information from a preprocessed wafer include temperature (e.g., wafer support temperature), chamber pressure, plasma parameters (e.g., plasma power, frequency, pulse characteristics, etc.), and time duration of a process or one or more steps of a process. The process settings may set manually or automatically (e.g., as part of normal process control).

Wafer structure parameters refer to parameters of interest for controlling a particular process or process chamber. They are parameters than can be assessed using metrology. Of interest spatial variations in wafer structure parameter values may be utilized to adjust, tune, or optimize a process to achieve a target distribution of wafer structure parameter values in postprocessed wafers. In some embodiments, wafer structure parameters are parameters that can indicate whether preprocessed and/or postprocessed wafers exhibit spatial uniformity over their surfaces, including wafer-to-wafer uniformity (including wafer-to-wafer mean offset) and/or within wafer uniformity. Examples of wafer structure parameters include geometric feature parameters such as feature depth, width, sidewall angle, and overlay, as well as parameters characterizing repeating structures such as critical dimension and pitch. Examples of wafer structure parameters include physical property parameters such as the thickness of one or more layers on a wafer and dispersive properties such as refractive index and extinction coefficient of one or more layers on a wafer.

"Machine learning model" is a trained computational model that, in some embodiments herein, receives as inputs optical metrology data reflective of feature characteristics, particularly feature geometries, substrate material properties, etc. on a substrate prior to processing in a device fabrication tool that is to be controlled using information computed by the machine learning model. Examples of machine learning models include neural networks, including recurrent neural networks and convolutional neural networks, autoencoders, including variational autoencoders, random forests models, restricted Boltzmann machines, recurrent tensor networks, and gradient boosted trees. Machine learning models are trained using a training set that reflects a range of conditions for which the model should be able to accurately predict appropriate settings for a device fabrication tool. In some embodiments herein, a machine learning model is trained using (i) raw or denoised optical metrology signals from features of a substrate that is to be processed using a particular device fabrication tool, (ii) one or more processing parameter values for processing the substrate in the device fabrication tool, and (iii) characteristics of the features after the substrate has been processed in the device fabrication tool using the one or more processing parameter values.

In general, though not necessarily, a neural network or autoencoder includes one or more layers. Each such layer includes multiple processing nodes, and the layers process in sequence, with nodes of layers closer to the model input layer processing before nodes of layers closer to the model output. In various embodiments, one layers feeds to the next, etc. The output layer may include one or more nodes configured to output information (a) representing wafer structure properties on a postprocessed wafer and/or (b) process chambers settings, such as temperature distribution on a pedestal, that are predicted to achieve target wafer structure parameter values during wafer processing. In some implementations, a machine learning model is a model that takes metrology data and outputs a wafer structure parameter value distribution after processing, a temperature distribution for applying to a pedestal, a chuck, or other wafer holding tool during wafer processing, or other process chamber parameter values during wafer processing.

In some embodiments, the model has more than two (or more than three or more than four or more than five) layers of processing nodes that receive values from preceding layers (or as direct inputs) and that output values to succeeding layers (or the final output). Interior nodes are often "hidden" in the sense that their input and output values are not visible outside the model. In various embodiments, the operation of the hidden nodes need not be monitored or recorded during operation. The nodes and connections of a machine learning model can be trained and retrained without redesigning their number, arrangement, interface with image inputs, etc. and yet provide a correction for a mass measurement.

Noise, in general, is used herein in the manner conventionally understood in the signal processing art. In the context of this disclosure, noise may include a portion of a metrology signal that is removed by a machine learning model. Pattern mixing is an example of the kind of noise that may be reduced or eliminated by using a machine learning model. Instrumentation error is another source of noise that may be reduced or eliminated by a machine learning model.

Etch depth refers to the distance between the bottom of an etched feature and a substrate top surface plane such as a field region. Examples of etched features having a depth include trenches and holes such as cylinders. In some implementations, the etch depth is compared in real time to an endpoint depth for an etch process being monitored. As examples, the features being etched have, at the conclusion of the etch process, a depth of between about 10 nm and 1 μm. As a specific example, the features being etched may have, at the conclusion of the etch process, a depth of about 10 μm. In some embodiments, the features being etched include vertically-stacked features, which may also be referred to as 3D structures. 3D NAND flash memory is one example of a device that may include vertically-stacked and etched features.

Critical dimension refers to the width of an unetched portion between sidewalls of adjacent etched features. Typically, the critical dimension is function of the depth below the substrate top surface plane. As examples, the features being etched may have, at the conclusion of the etch process, a critical dimension of between about 10 nm to 100 μm.

Line width refers to the width of a raised feature between two or more etched regions. Typically, the line width is defined by the corresponding mask feature width, and unlike the critical dimension, it does not vary with depth.

Pitch refers to the distance between center points of adjacent parallel lines.

Space critical dimension refers to a difference between the pitch and the line width. It can be viewed as the width of an etch opening.

Aspect ratio refers to a ratio of etch depth to the space critical dimension. It may be viewed as a measure of the thinness of an etched feature. As an example, a cylinder having a depth of 2 μm and a space critical dimension of 50 nm has an aspect ratio of 40:1, often stated more simply as 40. Shallow features have relatively small aspect ratios, and deep features have relatively large aspect ratios. The features formed through etch processes relating to the disclosed embodiments may be high aspect ratio features. In some applications, a high aspect ratio feature is one having an aspect ratio of at least about 5, at least about 10, at least about 20, at least about 30, at least about 40, at least about 50, at least about 60, at least about 80, or at least about 100. The space critical dimension of the features formed through the disclosed methods may be about 200 nm or less, for example about 100 nm or less, about 50 nm or less, or about 20 nm or less.

Introduction and Context

Although it is generally desired that wafer processing operations apply with uniform effect consistently from wafer to wafer, such uniformity, of course, is not a reality. Reduction of wafer to wafer (W2 W) variation, as well as other forms of non-uniformity such as within wafer non-uniformity (WiWNU), is required for advanced technology nodes. Upstream variation resulting in incoming variation is a major contributor for non-uniformity and yield loss across the wafer and between wafer runs. In some cases, non-uniformities may be anticipated to result from subsequent (downstream) processing operations. It is thus the task of the process engineer to devise effective strategies for dealing with processing non-uniformity—either, in the first instance, by preventing or minimizing it, or otherwise by compensating for it after it occurs, in some cases, at multiple stages of a processing workflow. Additionally, and possibly independent of W2 W variation and WiWNU, advanced processes require controlling wafer features down to nanometer-scale dimensions. This in turn depends on metrology at the nanometer scale.

One method to reduce variation and/or meet specifications with tight tolerances is to obtain optical metrology data of a wafer, derive geometric features or layer compositions from the optical metrology data, and use the derived features and compositions to determine processing parameters. However, the derived features and compositions may be inaccurate approximations. Further, even with highly accurate metrology, the collection and analysis of data can reduce throughput. In a typical process flow, one or multiple wafers are processed and then measured using optical or electron beams. The resulting signals may be computationally processed to generate nanometer scale metrology results. This information is then used to determine the optimal etch conditions of the following wafers in the lot or the subsequent lots. The collection and analysis of ex situ metrology data is very time consuming; it requires wafer transportation and the ex situ metrology itself. Overall process throughput suffers.

Further, in some implementations, the derived feature information needs to be translated into process adjustments that effectively reduce variation. This may require the experience, technical expertise, and/or intuition of highly trained process engineers. Even if such engineers are available, they may require time to devise appropriate process adjustments. In some cases, even the best engineers make mistakes when proposing process adjustments.

Another method to reduce the variation or meet tight specifications noted above is utilizing incoming wafer information obtained via optical metrology and a feed forward (FF) model to directly predict a processing parameter behavior and provide a recommendation per wafer. Such model employs optical metrology signals (e.g., spatially distributed metrology information) from preprocessed substrates or currently processed substrates (in situ information) as inputs. Such model may additionally employ one or more other pieces of information as input. Examples of such other information includes information taken from a current, previous, upstream or downstream process such as temperature (e.g., wafer support temperature), chamber pressure, gas flow rate, plasma parameters (e.g., plasma power, frequency, pulse characteristics, etc.), time duration of a process or one or more steps of a process, and design or configuration parameters for one or more components of a process chamber. Through a machine learning prediction, a model may recommend processing parameters for a particular wafer to then be applied by the process chamber to reduce non-uniformity such as WiWNU or otherwise achieve target metrics in a postprocessed wafer. In some embodiments, the machine learning model directly or indirectly provides process parameter values such as temperature values for positions on pedestal, plasma conditions, chamber pressure, gas flow rate, and/or the time duration of one or more process steps (or the entire process) that promote processing to achieve some target level of feature characteristic such as critical dimension, etch depth, pitch, etc. Setting this target level, which is effective across all features on the wafer, intrinsically promotes uniformity.

Fabrication Tool with Optional In Situ Metrology Components

FIG. 1 schematically illustrates an example of a fabrication tool 100 (e.g., a plasma processing system). The fabrication tool 100 includes a plasma reactor 102 having a plasma processing confinement chamber 104 therein. A plasma power supply 106, tuned by a match network 108, supplies power to a transformer-coupled-plasma (TCP) coil 110 located near a power window 112 to create a plasma 114 in the plasma processing confinement chamber 104 by providing an inductively coupled power. The TCP coil (upper power source) 110 may be configured to produce a uniform diffusion profile within the plasma processing confinement chamber 104. For example, the TCP coil 110 may be configured to generate a toroidal power distribution in the plasma 114. The power window 112 is provided to separate the TCP coil 110 from the plasma processing confinement chamber 104 while allowing energy to pass from the TCP coil 110 to the plasma processing confinement chamber 104. A wafer bias voltage power supply 116 tuned by a match network 118 provides power to an electrode in the form of a substrate support 120 to set the bias voltage on the substrate 132 which is supported by the substrate support 120. A controller 124 sets points for the plasma power supply 106, gas source/gas source 130, and the wafer bias voltage power supply 116.

The plasma power supply 106 and the wafer bias voltage power supply 116 may be configured to operate at specific radio frequencies such as, for example, 13.56 MHz, 27 MHz, 2 MHz, 60 MHz, 100 kHz, 2.54 GHz, or combinations thereof. Plasma power supply 106 and wafer bias voltage power supply 116 may be appropriately sized to supply a range of powers in order to achieve desired process performance. In addition, the TCP coil 110 and/or the substrate support 120 may be formed of two or more sub-coils or sub-electrodes, which may be powered by a single power supply or powered by multiple power supplies.

The gas source 130 is in fluid connection with plasma processing confinement chamber 104 through gas inlets 182 in a shower head 142. The gas inlets 182 may be located in any advantageous location in the plasma processing confinement chamber 104 and may take any form for injecting gas. Preferably, however, the gas inlet may be configured to produce a "tunable" gas injection profile, which allows independent adjustment of the respective flow of the gases to multiple zones in the plasma process confinement chamber 104. The process gases and byproducts are removed from the plasma process confinement chamber 104 via a pressure control valve 143 and a pump 144, which also serve to maintain a particular pressure within the plasma processing confinement chamber 104. The gas source/gas supply mechanism 130 is controlled by the controller 124. A collimator housing 184 is connected to at least one gas inlet 182.

In one embodiment, the controller 124 is configured to execute processing operations that utilize the spectral data collected by the spectral reflectometer 200 and/or other data reflecting process conditions or information about wafer 132 collected by sensors such as in situ monitoring sensors 136, in order to process carpet information. As mentioned above, a carpet is defined as a collection of frames representing instances of captured spectral data, and/or other data collected such as by sensors 136, in a time series. Spectral data collected by device 200 may be collected at predefined intervals, such as at every predefined number of milliseconds, seconds, or some custom time setting.

Fabrication tool 100 includes one or more in-situ metrology devices. The metrology device(s) may include, as examples, a spectral reflectometer device 200 and sensors 136. Sensors 136 may include, as examples, one or more voltage and/or current sensors (e.g., VI probes), one or more optical emission spectroscopy sensors (OES), one or more sensors for measuring absorption spectra of plasma and/or gases present in chamber 104, one or more sensors for measuring plasma density, one or more sensors for measuring process gas, byproduct, and/or other gas concentrations in chamber 104, and other suitable sensors for monitoring process conditions and/or various indicia of wafer properties.

Spectral reflectometer device 200 may, as an example, include components mounted within chamber 104 and components mounted outside of chamber 104. In some embodiments, spectral reflectometer device 200 includes an optical head inside of chamber 104, one or more light sources and light detectors outside of chamber 104, and an optical cable 140 or other component that optically connects the optical head to the light source(s) and detector(s). In one aspect, the spectral reflectometer device 200 has a collimator housing 184 that is connected to at least one gas inlet 182. Additionally, the collimator housing may be optically coupled, via optical cable 140, to the light source(s) and/or detector(s) of spectral reflectometer device 200. In this aspect, the optical cable 140 may include transmission optical fibers and receiving optical fibers. In other aspects, the optical cable 140 may include at least one optical fiber that conveys light from a light source in the spectral reflectometer device 200 and that also conveys light reflected off of the substrate 132. In one specific example, spectral reflectometer device 200 is configured to generate broadband light that is projected onto the surface of the wafer 132, while a detector in device 200 collects the spectral data associated with the reflected light from the surface of the substrate.

In Situ Reflectometer

Figure 2:
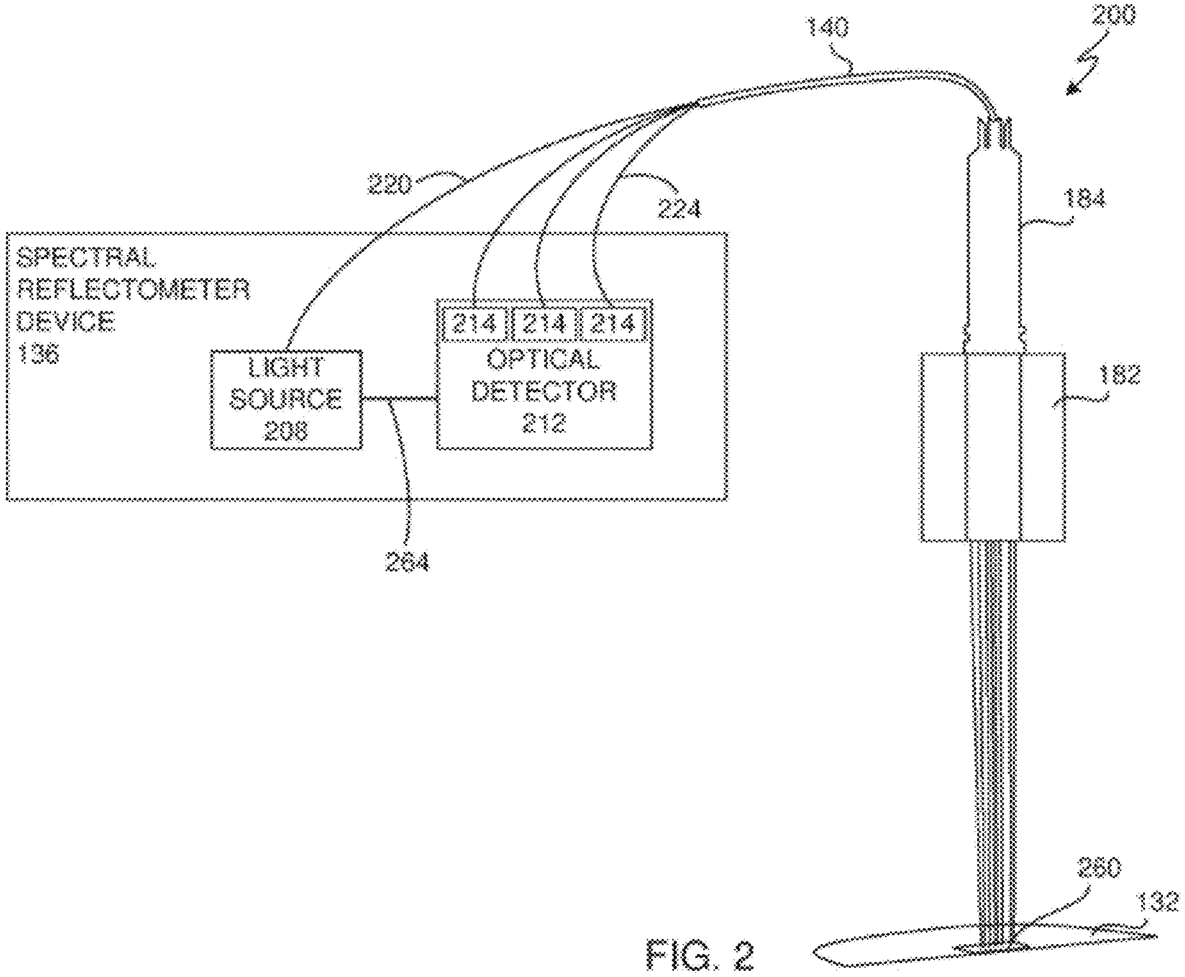
FIG. 2 is a schematic view of a spectral reflectometer system in accordance with certain disclosed embodiments.

FIG. 2 is a schematic view of a spectral reflectometer device 200. The spectral reflectometer device 200 includes a light source 208 and an optical detector 212. The optical detector 212 may include one or more photodetectors 214. The fiber optic cable 140 is connected to the spectral reflectometer device. In this example, the optical cable 140 includes transmission optical fibers 220 and receiving optical fibers 224. In this example each receiving optical fiber 224 is connected to an individual photodetector 214. In other embodiments a plurality of receiving optical fibers 224 may be connected to the same photodetector 214. In this example, the optical detector 212 is a two dimensional charge couple device (2-D CCD) array where an output from each receiving fiber 224 is detected by different regions of the 2-D CCD. For a spectral reflectometer system, the optical detector 212 provides output of intensity as a function of wavelength. This may be accomplished by using a prism or a filter that is able to separate out one or more wavelengths from the reflected light. Light may be directed from the light source 208 to the optical detector 212 through a fiber 264 to allow the monitoring of light source 208 variations over time to correct the signal and improve signal-to-noise ratio (SNR).

Light source 208 may include, as an example, a xenon arc lamp. Such a xenon arc lamp may provide a pulsed non-uniform beam. The xenon arc lamp 208 may be coupled to the transmission optical fibers to provide light to the collimator housing 184. The photodetectors 214 are coupled to the receiving optical fibers to receive light reflected from the substrate 132.

Process Control in Multi-Step Fabrication Processes

Systems and techniques are provided for process control, endpoint prediction, or other parameter prediction in multi-step fabrication processes. As a first example, multi-step fabrication processes may include atomic layer deposition processes (ALD), atomic layer etch processes (ALE), and other similar processes that involve alternating between steps such as self-limiting steps. As a second example, multi-step fabrication processes may include deposition and etching processes, including plasma-based etching processes that may not be self-limiting, where the a given process step is divided into multiple discrete steps. As a particular example, etching or depositing a particular feature may be done in multiple discrete steps, with pauses between those steps and with the optional performance of other related and non-related fabrication processes between those discrete steps. Processes involving multiple non-contiguous steps may have pauses between the steps, while processes involve multiple contiguous steps may lack pauses between the steps. Examples of endpoint prediction in semiconductor fabrication processes are described by Bailey, III et al., U.S. Pat. No. 10,032,681 and Feng et al., U.S. Pat. No. 10,262,910, each of which is hereby incorporated by reference in its entirety and for all purposes.

In some embodiment, a time-series of spectra information extracted during processing of multi-step processing operations may be utilized in order to control endpoint operations (e.g., to adjust the time of one or more intermediate and/or final steps of a given multi-step processing operation). The methods and systems utilize training processes to generate data representations or models sometimes referred to herein as "carpets." A carpet refers to a representation constructed from multiple sampled frames of spectra information, such that time information of not only a current frame, but of one or more previous frames, are sampled. As a result, the carpet defines a representation of a series of time (t) samples, and each time sample has its associated spectra information (k, i.e., wavelength). The carpet therefore provides not only spectra information at one specific point in time, but also a history of change(s) in spectra information over one or more prior samples of spectra information. In some examples, carpets may be three-dimensional surface profiles.

In one embodiment, carpets are generated during training to produce a virtual carpet. The virtual carpets are, in one embodiment, a representations of broadband in situ reflectometry spectra responses produced from carpet profiles via polynomial regression or other fitting in both time and spectral dimensions. The resulting fitting may produce one or more polynomial parameters (e.g., coefficients) that characterize a carpet or virtual carpet. An example virtual carpet generated using such spectra is essentially a representation of multiple time slices/frames, in which intensity as a function of wavelength is captured for each frame. Thus, for each time sample, a frame is captured, which also enables use of one or more prior frames that were captured, as the virtual carpet is produced. Carpet processing during real-time processing has an additional benefit of decoupling spectra changes due to wafer level variations from the time evolution of spectra due to multi-step fabrication processes including, e.g., etching and/or depositing.

In one embodiment, machine learning may be implemented to use the time-series of spectra to extract critical conditions of the wafer. In one embodiment, a training phase is used, wherein a number of wafers are processed in a multi-step fabrication process using a target process recipe. The training phase can be implemented using one or more process chambers, which implement a target process recipe. Wafer level variations can be introduced in many ways, such as due to variations in previous steps of wafer processing, variations in chambers or process conditions therein, variations in wafer properties, variations in wafer lots, variations in possible wafer tilt or rotation, and other wafer level variations. The result is that fabrication processes will vary, even when the same target recipe is used on the same machine. However, in accordance with one embodiment, during the processing of each wafer, spectral data are sampled over a period of time of the multi-step fabrication process for a plurality of wafers. The sampling therefore produces a plurality of sampled frames of spectra information, defined as intensity as a function of $\lambda$.

The time series of frames therefore define data of a three-dimensional (3D) surface representing intensity. In this embodiment, the carpet therefore provides historical information of changes in the spectral intensity, not just a single intensity spectra graph. For each wafer or associated carpet used for training, a measurement is made of wafer parameters of interest including, as examples, depth of etch, CD, etc. Measurement may be conducted with any number of metrology tools. One example way is to use a spectrometer to measure spectral reflectance off of a wafer. Another example way is to use optical CD (OCD) metrology which may include reflectance and/or ellipsometric spectroscopy. OCD metrology and spectral reflectance metrology can be used to determine various metrics, including etch depth, deposition thickness, feature characteristics, pre-etch CD, post-deposition CD, feature or etch or deposition profiles, etc.

In one embodiment involving multi-step etching processes, the measured depth of etch is correlated to the last frame of the carpet, which includes spectral intensity at the state where depth of etch was measured. In one embodiment involving multi-step deposition processes, a measured amount of deposition can be correlated to the last frame of the carpet, which includes spectral intensity at the state where amount of deposition was measured. Because the carpet also holds information regarding previous frames, it is useful to understand what the spectral conditions were that lead up to the final frame. In one embodiment, each carpet has relevant data extracted by, e.g., fitting the experimental spectra with a polynomial of order m*n, having unique coefficients (C0, . . . . Cmn), where m denotes the order in time dimension and in the order in wavelength dimension. More generally, the fit algorithm may be a regression method to minimize the figure of merit, which is defined as the difference of polynomial estimate and experimental spectra.

In one embodiment, an operation is introduced to reduce dimensionality of the polynomial coefficients. This dimensionality reduction can be implemented by either stepwise regression, multi-carpet coupled regression, or principle component analysis. The objective of dimensionality reduction is to use relatively few dimensions to account for the variations among carpets and to correlate successfully with the etch depth measurement, the deposition amount measurement, or other similar measurement, in terms of floating parameters in these hyper dimensions and virtual frame number representing etch, deposition, or other processing time impact.

In one embodiment, regression is performed by executing a multi-carpet coupled regression. The responsible logic is configured to take the measured depth of etch (or other wafer structure parameter value(s)), correlate the measured structure parameter value(s) to polynomials of the carpets generated during the training, and then fit them into a polynomial with reduced dimension of parameters (C0, . . . Cp), that define a virtual carpet, by, e.g., using a combined mean square error (MSE) inclusive of all carpets.

In one embodiment, some polynomial coefficients are coupled across the carpets, defined by a linear relationship, to represent carpet-to-carpet constancy while leaving the rest floating. The choice regarding which parameters to couple and which to float is determined by the impact on the mean square error between the carpets and experimental spectra.

In another embodiment, dimensionality reduction is accomplished by stepwise parameter reduction.

Correlation of reduced parameter space to the etch depth or other wafer structure parameter measurement, in terms of R square and adjusted R square, is evaluated as parameter space is adjusted to find good correlation with least parameters. Not all parameters are needed to correlate against etch depth measurement. This is an example of training a model to predict etch depth or other wafer parameter from virtual carpets.

In still another example implementation, principal component analysis (PCA) is used to find the correlation of scores of principle components, virtual frame number, and measured etch depth. The number of principle components can be increased to reach better correlation. Once satisfactory correlation is reached to explain measured etch depth with reduced hyper dimensions from above and virtual frame number, training is complete.

In the case where the difference of polynomial parameter(s) of training carpets is small and virtual carpet frame number itself is enough to account for the measurement of etch depth, deposition amount (which may be a depth of deposited material), or other metrology measure with desired accuracy, the polynomial parameter(s) of a virtual carpet may be obtained by an average of polynomial fit coefficients.

In another embodiment, the spectral response of a reference wafer may be used to compare to other wafers. Additionally, there are several other ways of linking the polynomial coefficients and virtual frame number, to etch depth, deposition amount, or other wafer structure parameter. This linking is a form of training. One such method is a partial least square method, and in another embodiment neural network processing is employed to establish a relationship of parameters to measured etch depth.

Once the training process is complete, the virtual carpet can be used during real-time processing of production wafers to determine endpoint in multi-step fabrication processes (e.g., adjusting the time of an intermediate step and/or a final step of a multi-step fabrication process.) In one embodiment, the virtual carpet information is used, in conjunction with real-time spectra, to predict effective etch depth, deposition amount, or other metrology measure as a function of spectral history. More information regarding the use of the virtual carpet will be described with reference to the figures.

In various embodiments, a virtual carpet is a form of machine learning model that relates wafer features and/or wafer processing conditions to in situ collected time varying, spectral data from a wafer's processing environment. The machine learning model may be configured to receive, as inputs, features extracted from the time varying, spectral data.

As indicated, instead of measuring etch depth or deposition amount, the virtual carpet (machine learning model) can be linked to critical dimension (CD) measurements, line width, pitch, spacing, bow detection metrics, sidewall angle, and other measurable metrics. That is, for each wafer processed during the training, the resulting carpet can be correlated to one or more measured metrics, which can include but are not limited to etch depth. In general, the resulting carpet can be correlated to any metric having spectral sensitivity (e.g., any metric where variations in that metric impact spectral measurements). By way of example, wafer bow is described in Lam Research Corporation U.S. Pat. No. 9,123,582, which is incorporated herein by reference.

In one embodiment, during real-time processing (i.e., run-time), the virtual carpet (machine learning model) can be used to predict one or more intended wafer properties (e.g., etch depth, deposition amount, etc.). This process therefore enables accurate predication of multi-step process rates at a wafer level, and time to stop the multi-step process. Broadband in situ reflectometry or interferometer measures of reflectance of the wafer surface during etching, deposition, or other multi-step processes, by focusing a light beam on a spot onto the wafer and measuring the intensity of the reflected light in a plurality of wavelengths. One example of broadband in situ reflectometry is flash lamp/continuous wave reflectometry (e.g., which is sometimes referred to as Lam Spectral Reflectometer (LSR)). For more related information on in-situ interferometer systems, reference may be made to Lam Research Corporation U.S. Pat. Nos. 6,400,458, and 6,160,621, which are incorporated herein by reference.

In another implementation, a dynamic time wrapping (DTW) algorithm can be used to calculate a matching of spectra against a reference spectra, which can then be directly used to calculate etch rate and ideal etch stop, deposition rate and ideal deposition stop, or the like in other multi-step fabrication processes.

There are several advantages of using time series of spectra. One advantage is that it ensures model dependence of causal relations of spectra. This acts to constrain the modeling parameters and also provide added accuracy. By way of example, the same spectra of two different time series could tell different conditions of the wafer, as bias could come from incoming variations. An additional advantage is that the spectral and temporal covariances are explicitly modeled in the virtual carpet (machine learning model) to preserve information content. Thus, there is no loss of experimental information. Still further, an advantage of scalability is ensured to handle large amount of experimental spectra, as each carpet is fit individually.

Training of the algorithm for active control is faster than many other physics based models requiring extensive physical modeling. Additionally, run time execution speeds are also faster than physically based models for such complex reflectance from mixed arrays.

It should be understood that the methods described herein are not limited to light intensity spectra. The methods can be applied to any set of signals in time appropriately scaled, where within each time frame the correlated signal can be represented in 'x' with a particular signature of correlation in the sense of principal components along x as a 'spectra' in time, and the same dimensionality reduction and training strategies can be adopted. For example, time traces from multiple sensors related to the electrostatic chuck (ESC) can be analyzed in similar fashion to predict the CD (critical dimension) or CD uniformity in analogy to wavelength time traces from wafer to predict local depth, deposition amount, or other property associated with a multi-step fabrication process. The covariance of these non-spectral signals can be handled by, e.g., principal component analysis to extract essential information for given time frame, therefore enabling endpoint control at higher accuracy.

It will be apparent that the present embodiments may be practiced without some or all of these specific details. For example, applications are not limited to those tied to etch rate, the deposition rate, etc. Well-known process operations have not been described in detail in order not to unnecessarily obscure the present embodiments.

Further, the model for predicting etch depth or other wafer parameter may employ as inputs one or more non-spectral and/or non-time varying, spectral parameter(s). Examples of such parameters include the temperature of one or more components of the manufacturing equipment (e.g., wafer pedestal temperature), the pressure of a process chamber, plasma properties in the equipment (e.g., plasma power, frequency, voltage, current, pulse characteristics, etc.), gas flow rate at one or more locations in the equipment, and/or time duration of one or more preceding steps in the process. A non-spectral input parameter may be time varying (values provided at multiple times) or non-time varying (value provided at a single time). Any such parameter may be provided from the current process (the process being controlled), a previous process (e.g., an upstream process in a different manufacturing equipment), or a subsequent (e.g., an downstream process where the control parameters are known at the time of the current process). Collectively, time varying spectral information (e.g., carpets) and optionally one or more non-spectral or non-time varying parameter values are provided as inputs to the model. Acting on these inputs, the model outputs information, such as predicted wafer surface characteristics, that may be used in a feed forward control (e.g., endpoint prediction of one or more steps in a multi-step process).

As an example, consider a multi-step process in which the step under consideration is called the "current step." A model or other control logic (e.g., logic using a correlation between carpet polynomial parameters and process endpoint) is configured to provide information about the current step. However, inputs to the logic may come from any of various temporal stages or steps in the multi-step process. For example, the current step may be step 10 of a 20-step process. Steps 1-9 are upstream steps while steps 11-20 are downstream steps. Input parameters may be obtained from any one or more upstream steps, any one or more downstream steps, the current step, or any combination thereof, The multiple steps of a multi-step process may have any of various requirements and functions. For example, a chamber or manufacturing equipment may support a multi-step process that employs different process conditions from one step to the next. In some embodiments, the different process conditions can exist from one cycle to the next of a multi-cycle, process, such as ALE or ALD. For example, the duration of a dose, purge, or plasma phase of a cycle may vary between cycles. In other cases, the process conditions may vary from one step to another of a non-cyclic process. For example, one step of a multistep process may be designed or tuned for controlling etch depth while a subsequent step may be designed or tuned for controlling CD of etched features. Thus, a current step of the multistep process may have one set of process parameters, while an upstream or downstream step may have a different set of process parameters, or at least one of the parameters may be different from the current step and the upstream or downstream step.

In some embodiments, all steps of a multi-step process are performed in the same manufacturing equipment or chamber, which is configured to adjust at least one process condition from step-to-step. For example, a substrate pedestal temperature distribution, plasma conditions, pressure, or a flow rate of an etchant or deposition precursor gas may change from one step to the next. In some embodiments, the current step (step 10 in the above example) is performed in a first manufacturing equipment or chamber, while one or more of the upstream or downstream steps is performed in a second manufacturing equipment or chamber. Both the first and second equipment or chambers are separately configured and may have separate process conditions such as temperature, pressure, plasma conditions, or flow rates.

While a downstream step has not yet occurred when a model is processing information for a current step (e.g., the model is determining an endpoint), known or expected process parameter values for the downstream step may be included as inputs to the model. Thus, even though the downstream process has not yet been performed at the time a model is being executed and the current step is being performed, the expected value of temperature or other parameter for the downstream process can be used as an input to model for the current process step.

The process conditions input to a model may be set or adjusted automatically at the equipment level (by, e.g., a recipe or pre-coded feedback or feedforward process control) or at the fabrication facility level (e.g., by an operator making decisions based on metrology or other post-processing information). Conditions set at the facility level may override recipes or other process settings provided with the equipment.

Collectively, the input parameters to a model for a current step may be referred to as feed forward parameters, regardless of whether the parameters characterize the current step, an upstream step, a downstream step, or some combination thereof.

Figure 3:
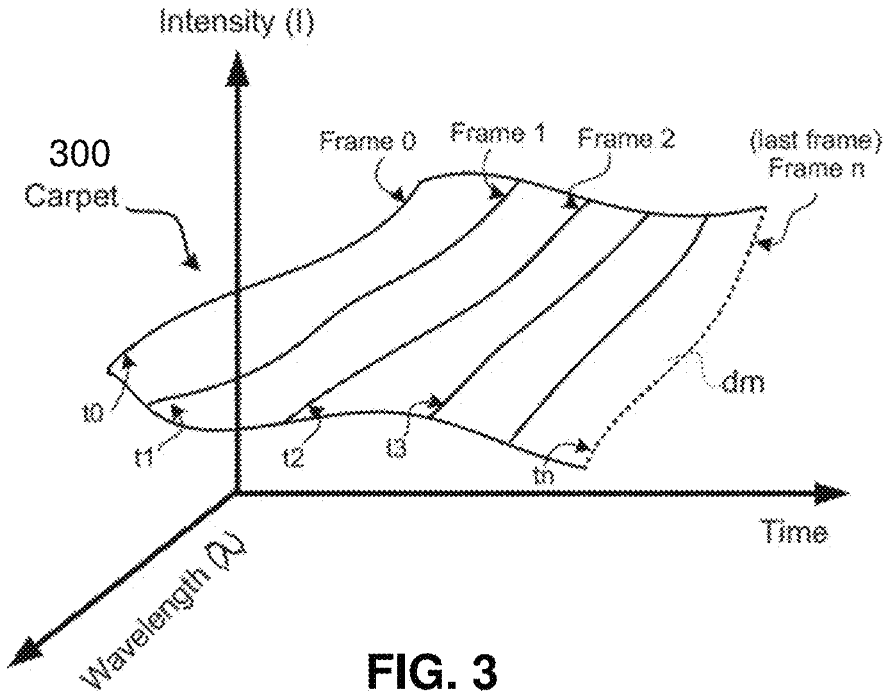
FIG. 3 illustrates an example of a carpet in accordance with certain disclosed embodiments.
Figure 4:
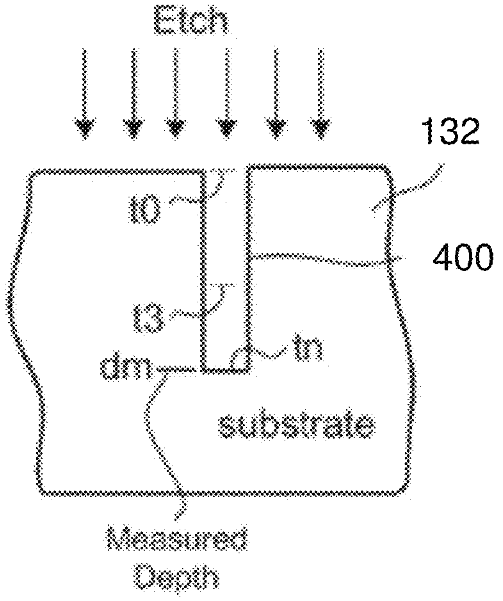
FIG. 4 illustrates an example cross-section of a feature being etched, to a desired depth, in accordance with certain disclosed embodiments.

FIG. 3 illustrates an example of a carpet 300, which is a three-dimensional abstraction of the surface generated by time-series captures of frames, where each frame represents an instance in time that categorizes intensity as a function of wavelength. As shown, frame 0 is the first frame captured for the carpet 300, and each subsequent frame up to frame n, represents the carpet for an etch operation, such as that illustrated in FIG. 4, represents the carpet for a deposition operation, and/or represents the carpet for another fabrication operation. Each of the frames 1-n, is captured at specific times, t0-tn, which can extend over multiple cycles of a multi-cycle fabrication process. Each frame therefore has its own respective spectra that is descriptive of the intensity in terms of wavelengths. As each frame is captured, the carpet 300 is constructed, therefore exposing information regarding the changes in the intensity in terms of wavelength as time progresses.

Thus, information is being gathered not only of a single timeframe where intensity as a function of wavelength, but also the continual changes of the intensity as a function of wavelength for a plurality of times. Thus, at any one point in time, it is possible to ascertain the changes that occurred that led up to the current state of time. Thus, in embodiments involving multi-step etching processes, this information will expose what intensity changes occur as the substrate 132 is being etched to define etch feature 400. Similarly, in embodiments involving multi-step deposition processes (or other fabrication processes), this information will expose what intensity changes occur as material is being deposited on the substrate 132 (or as the other fabrication processes modify the substrate 132 in some matter).

The example shown in FIG. 4 shows a single etch feature, but it should be understood that etching operations are typically carried out substantially simultaneously for any number of features which could be smaller than the wavelength of light, and might correspond to a single field or many fields of lithography exposure, distributed throughout a semiconductor wafer. Similar situations occur in deposition and other fabrication processes, where deposition and modifications associated with other fabrication processes can be distributed throughout a semiconductor wafer. In some embodiments where a single reflectometer sensor is used, only the spectra time series under the spot of illumination is collected, but such spectra time series is used to control the endpoint of the entire wafer. In other embodiments involving multiple reflectometer sensors or one or more reflectometer sensors that can collect information from multiple locations within a semiconductor wafer, the combination of spectra time series can be used to control the end-point of the entire wafer. When feature critical dimension and depth changes as etch progresses, diffraction of incoming beam would generate a change of intensity in the far field as a function of wavelength and result in intensity change at the spectrometer. Similarly, when aspects of a semiconductor wafer change as a deposition or other fabrication process progresses, diffraction of incoming beam would generate a change of intensity in the far field as a function of wavelength and result in intensity change at the spectrometer.

Thus, the illustration of FIG. 4 is provided to show that as the etch progresses, frames of spectral intensity as a function of wavelength will continue to be captured, thus building and defining the carpet 300. In one embodiment, for a specific wafer processing operation, such as an etch operation, the feature being etched will reach a specific depth, which is shown in FIG. 4 as a measured depth (dm). At that point, the etch operation is complete, and the carpet 300 of FIG. 3 is complete. This results in the last frame (e.g. frame n), being the frame that corresponds to a measured depth dm, at time tn. Note that deposition operations may be evaluated in a similar manner.

The illustration of carpet 300 of FIG. 3, and the etch operation in FIG. 4, were shown to illustrate the capture of multiple frames of spectral data. It should be understood that many more frames will be captured, based on the desired sampling frequency, which can provide a more dense carpet 300 with rich information associated with changes in feature CD, depth, or profile information at the wafer level. In one embodiment, the carpet 300 is said to change as a function of time, which is uncovered by the multiple frames captured as a function of wavelength. The carpet 300, in one embodiment, can be characterized using a mathematical polynomial, with its associated coefficients, for a range of wavelengths. The coefficients of the polynomial will therefore define a surface in time and wavelength, which can be accessed as will be described below.

As described above, one embodiment described herein utilizes a training process that requires that multiple wafers be processed for a specific multi-step etch recipe and multi-step etch process and/or for a specific multi-step deposition recipe and multi-step deposition process. In some embodiments, the same chamber 104 will be used for various wafers. In other embodiments, different chambers can be used for each of the wafers. Each of the wafers processed during the training operation will produce a respective carpet 300. Each of the carpets will define the characteristics seen by the in-situ monitoring devices includes spectral reflectometer 200 and/or sensors 136, in terms of the spectral and other data captured at each of the frames, based on the sampling frequency. Once a plurality of carpets are defined, these carpets can be fit using, e.g., a polynomial fit algorithm to generate a carpet with floated, fixed, and/or coupled coefficient parameters, which is referred to herein as a virtual carpet (machine learning model).

Figure 5:
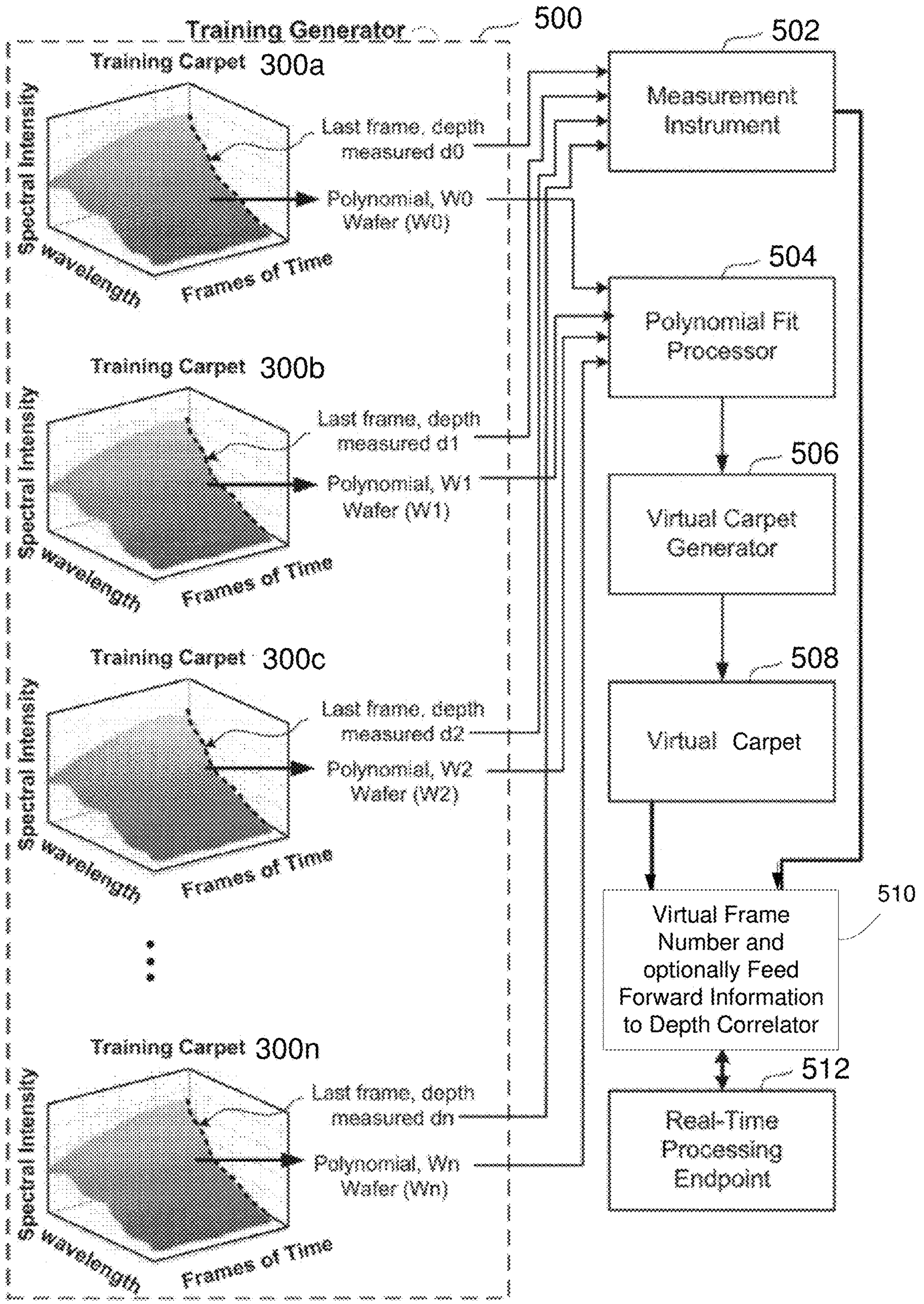
FIG. 5 illustrates more detail regarding the use of a training generator, which includes generating carpets for each of the training wafers, in accordance with certain disclosed embodiments.

FIG. 5 illustrates more detail regarding the use of a training generator 500, which includes generating carpets for each of the training wafers, in accordance with one embodiment. As shown, the training generator 500 includes the generation of carpets 300*a*-300*n*, where each carpet is associated with a respective polynomial (e.g., polynomial parameter such as coefficients), and each carpet has a last frame that is to be correlated to a measured depth of etch or to a measured depth of deposition or other wafer parameter. Because there will be variations between process conditions, chamber configurations, and other factors, it is possible that the etch or deposition termination when generating each of the carpets will be different. This effect would be modeled by, e.g., the loading of polynomial coefficients via stepwise regression, multi-carpet coupled regression, or principal component analysis, where the parametric difference of different carpets would reveal its impact on end-point estimate and subsequently be determined via linear regression against measured etch depth. In some embodiments, the carpets are provided with other information about process conditions such as temperatures, pressures, plasma conditions, gas flow rates, process durations, chamber component configurations, etc. This additional information may account, at least partially, for the variations between process conditions, chamber configurations, etc.

In some embodiments, the various wafers may intentionally be etched to different depths (or have different depths of deposited material), so as to generate various size carpets 300. In some embodiments, the various training wafers may be etched (or deposited onto) with different numbers of etching steps and one or more parameters (e.g., etch depth, critical dimension, etc.) may be extracted reflecting different numbers of steps of etching (or deposition or other multi-step processes). Such embodiments may facilitate the creation of a virtual carpet (machine learning model) for multi-step fabrication processes. In either case, each of the carpets 300 are captured, in terms of their polynomial and associated coefficients. As mentioned above, the various coefficients of the polynomial will be descriptive of the three-dimensional contour shape of the carpet, which was defined by the multiple frames captured over time for that etch or deposition operation. In this example, a polynomial fit processor 504 is configured to receive the spectral frames from each of the carpets 300*a*-300*n* and, as an example, output polynomial coefficients. Additionally, the measured depths for each of the wafers associated with each of the carpets 300*a*-300*n*, will also be captured by a measurement instrument 502. The measurement instrument 502 can take on various forms, and broadly speaking are semiconductor metrology tools that are capable of measuring specific parameters or metrics of a wafer and features on the wafer. Examples include cross-sectional SEM, TEM and scatterometry.

The polynomial fit processor 504 is configured to communicate with a virtual carpet generator 506 (e.g., comprising a machine learning system). The virtual carpet generator 506 is a dimensionality reduction and linear regression process by which a virtual carpet (machine learning model) 300 is generated. The virtual carpet 300 is configured to have a predefined size, in terms of frames of spectral data, which is spectral intensity as a function of wavelength. The polynomial fit processor 504, as mentioned above, is configured to receive the spectral frames of the various carpets 300*a*-300*n*, and thus fit them in accordance with the constraints defined by the virtual carpet generator 506. In one embodiment, the virtual carpet generator 506 is configured to generate a virtual carpet (machine learning model) 508, which can be generated by various techniques described above.

The virtual carpet 508, is therefore generated, and the virtual carpet 508 as well as the measurement instrument 502 outputs are correlated in 510 to associate the virtual frame numbers of the virtual carpet (machine learning model) to a specific depth or metric that was measured by measurement instrument 502. Thus, during real-time processing and endpoint operations 512, the controller of a chamber can access the virtual carpet (machine learning model) 508 and/or the virtual frame number to depth correlator 510, to identify when a multi-step etch or multi-step deposition process has reached its end point. In some embodiments, information in addition to spectral/carpet information is together correlated with etch depth or other wafer parameter. Thus, for example, correlator 510 may be configured to consider not only virtual carpet information but other information that might be used in feed forward processing. Such other information may include operating conditions in the equipment where the etch or deposition is occurring. Examples include temperatures, flow rates, pressures, plasma conditions, time duration of steps or sub-steps, and chamber component configurations. The operating conditions may be set or adjusted automatically at the equipment level (by pre-coded feedback or feedforward process control) or at the fabrication facility level (e.g., by an operator making decisions based on metrology or other post-processing information). Conditions set at the facility level may override recipes or other process settings provided with the equipment.

An endpoint is reached when the etching or deposition process has reached the intended etch or deposition depth for the specific features being fabricated, and by use of the virtual carpet, the endpoint can be reached by associating a portion of a currently processed carpet (i.e., for a current fabrication operation), to the virtual carpet 508. In some embodiments, endpointing can involve altering the length of an intermediate step in a multi-step fabrication process, as opposed to merely altering the length of a final step.

By way of example, real-time processing of real fabrication wafers can utilize this algorithm where the controller is generating a carpet for the current etch or deposition operation. During processing, frames are being produced for a carpet, which are added to previous frames already produced. In one embodiment, a current frame and one or more previous frames (i.e., a patch) can be used from the currently generated carpet during real-time processing of an etch or deposition, to perform a fitting to the virtual carpet. By fitting to the virtual carpet in a dynamic and real-time manner, it is possible to identify a predicted depth of etch or deposition in real time. As noted above, the virtual carpet will hold information regarding virtual frame numbers, which are pre-correlated to etch depths, deposition depths, or the like.

As will be described below, the various etch depths or deposition amounts can be approximated from the various wafers processed during the training session. And, that previous training session produced the virtual carpet, so therefore, information regarding the predicted etch depth or deposition amount for currently captured frames of spectral data (or a patch of frames), will produce a tightly correlated estimate or prediction of the actual etch depth or deposition amount. Thus, by continuing to process the carpet during real-time processing, a point will arrive where the frames being fitted and mapped to the virtual carpet will be indicative of the desired depth, for a specific etch operation, or of the desired deposition amount, for a specific deposition operation. At that point, the controller of the chamber can indicate to the system that the endpoint has been reached, and the etch operation or the deposition operation will be stopped.

Figure 6:
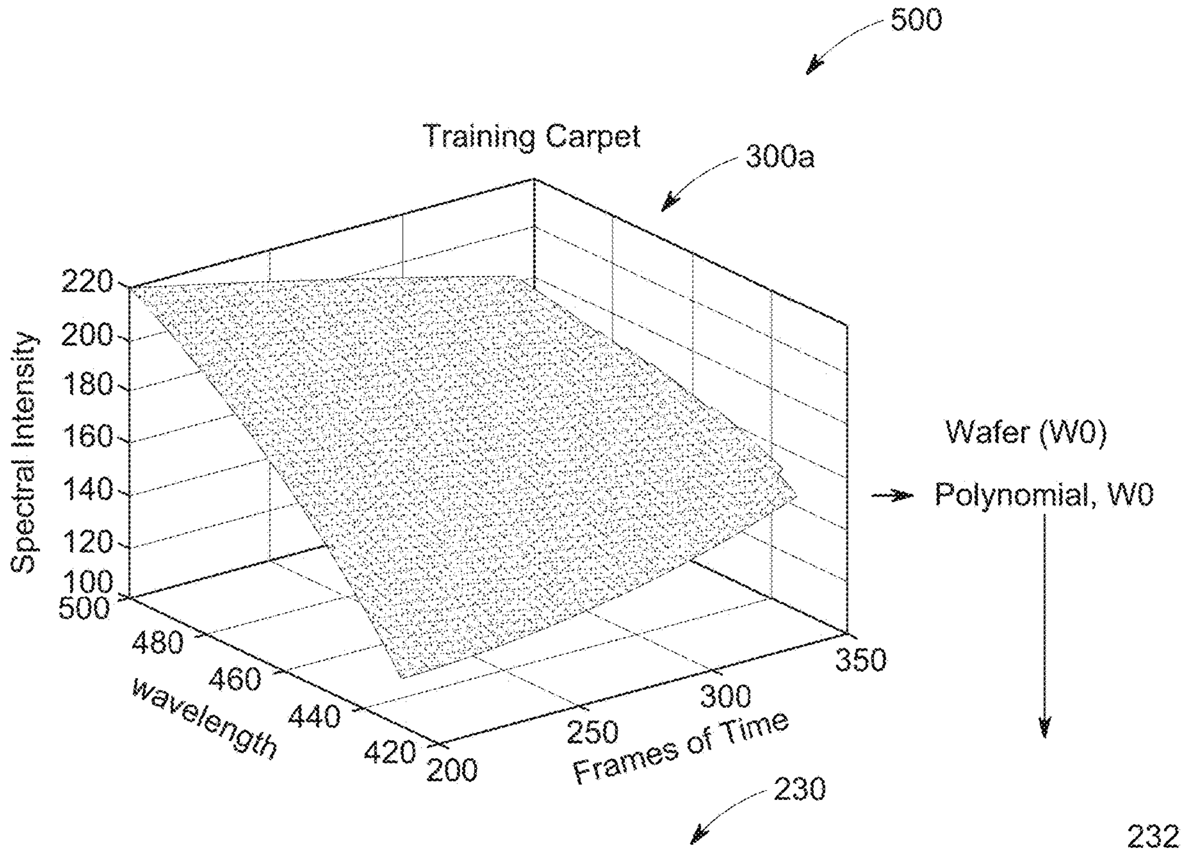
FIG. 6 illustrates an example of a carpet, producing its corresponding polynomial when a wafer is etched during training, in accordance with certain disclosed embodiments.

FIG. 6 illustrates an example of a carpet 300*a*, producing its corresponding polynomial when a wafer (W0) is etched (or deposited onto) during training, in accordance with one embodiment. In this example, it is shown that carpet 300*a* was produced as a result to real frame samples 230, which includes frame numbers 231 and time 232. At the completion of the etch (or deposition) operation process to generate the carpet 300*a*, a final frame from the various samples frames is reached. In this example, the final frame is frame 467. Frame 467 is only shown as an example number, and the frames captured will depend on the sampling frequency, and duration of an etch (or deposition) operation.

Continuing with the example, frame 467 will be associated with a measured etch depth (or measured depth of deposition) or some other parameter or metric that is being inspected or measured by a measurement device or system. As mentioned above, it is also possible to measure or correlate the frames of spectral intensity as a function of wavelength for different metrics. Such metrics, may include critical dimension inspections, bow characteristics in wafers, and other metrics that are commonly measured or are measurable.

Figure 7:
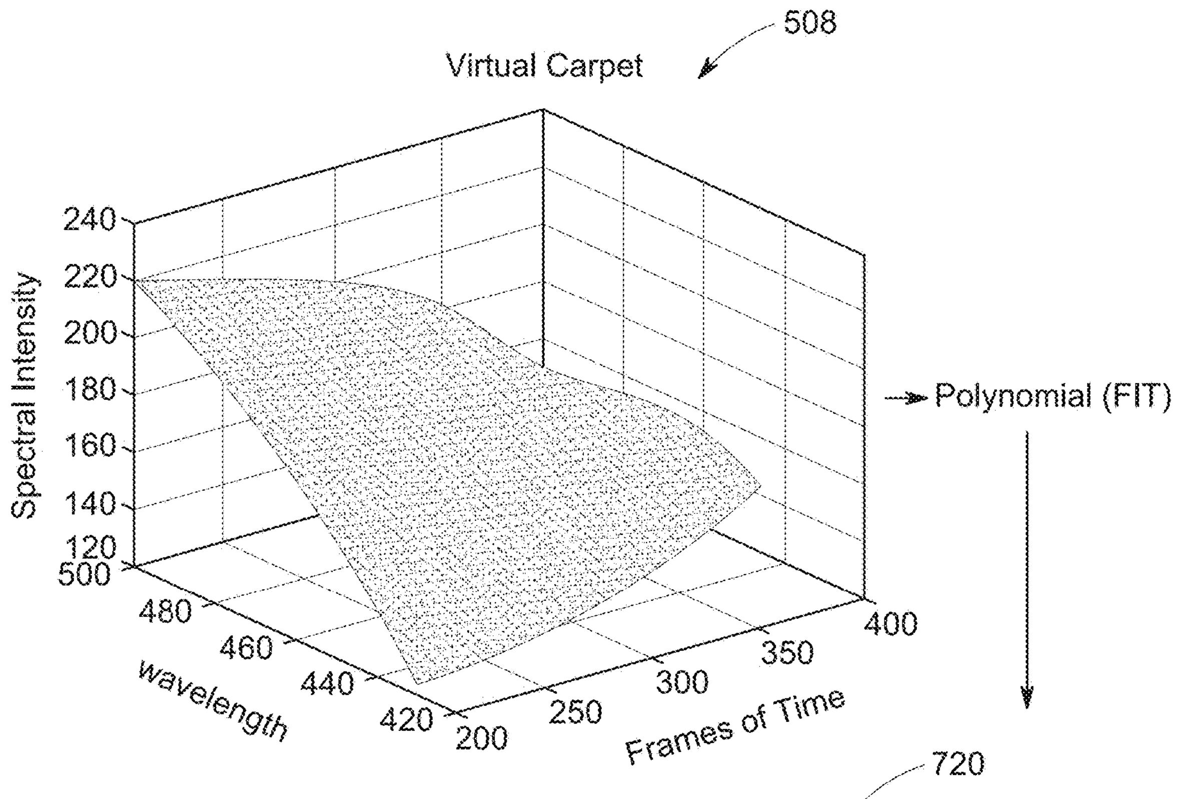
FIG. 7 illustrates an example of a virtual carpet, having its corresponding polynomial, which is derived from all of the polynomials generated during the training operation.

FIG. 7 illustrates an example of a virtual carpet (machine learning model) 508 having its corresponding polynomial, which is derived from all of the polynomials generated during the training operation. As shown, for this virtual carpet, virtual frame samples 720 are also identifiable, where virtual frame numbers are associated with different times, which are derived from multiple real frame samples 230, which correspond to all of the polynomials generated from the various carpets produced from different wafers during training. The virtual frame samples 720 will also include virtual frame numbers 721 and the corresponding time 722.

In this example, because the virtual frame numbers have been standardized, the virtual frame numbers will extend from virtual frame number 0 to virtual frame number 300. It is understood that the virtual frame numbers of all of the various training carpets will have different numbers of frames, and the various frames and their associated polynomial coefficients are derived so that they are standardized to the set of virtual frame numbers defined for the virtual carpet 508. By generating the virtual carpet 508, it is possible to extract out the variations that occur from the various training carpets, and thus generate and eliminate abnormalities or false positives that may have occurred in each individual carpet. Further, by generating virtual carpet 508, is possible to use virtual carpet 508 for later reference by processes that are running production wafers, and such production wafers can utilize the virtual carpet 508 identifying end point.

Figure 8:
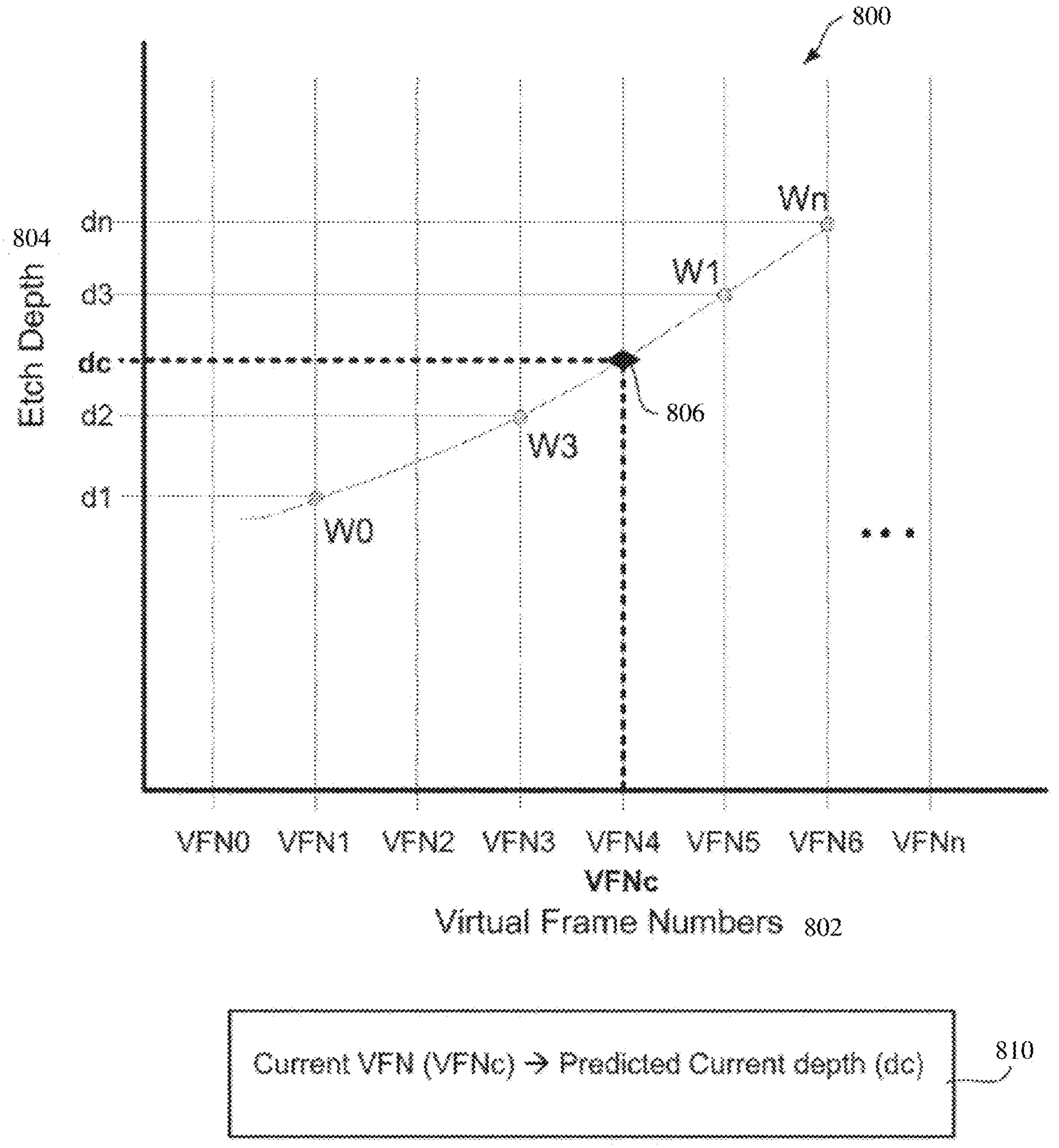
FIG. 8 illustrates an example of a mapping chart between the virtual frame numbers of the virtual carpet and measured depths for the etch operations performed during the training that produce the various carpets, in accordance with one embodiment.

FIG. 8 illustrates an example of a mapping chart 800 between the virtual frame numbers of the virtual carpet (machine learning model) 508 and measured depths 804 for the etch operations (or measured deposition amount for the deposition operations) performed during the training that produce the various carpets, in accordance with one embodiment. During processing of a fabrication wafer, the controller can be generating its own carpet, defined by a plurality of frames having intensity as a function of wavelength. As the carpet is being generated, periodically two or more of the frames, or a patch of the carpet, can be captured and fitted to the virtual carpet 508. By fitting into the virtual carpet 508, it is possible to identify the virtual frame number 802 of the most current frame being processed by the chamber performing the etching on a wafer.

As shown in 810, the current frame number (VFNc) can be identified from the virtual frame numbers 802, and correlated to predict the current depth (dc) from the etch depth 804 of the mapping chart 800 (or the deposition depth of a corresponding mapping chart). As shown in the mapping chart 800, the various test wafers used during training can also be mapped to the chart, which will produce a substantially linear approximation. The linear approximation will show the depths that were measured for each of the test wafers, as they were associated to the last frame in the respective carpets 300. This illustrates that wafer 0 was etched to a depth d1, wafer 3 was etched to a depth d2, wafer 1 was etched to a depth d3, and wafer Wn was etched to a depth dn.

These steps can be shown to occur substantially along a substantially straight line, as the virtual frame numbers are a fitted representation of the frames collected from each of the carpets 300. Thus, it is expected that the standardization provided by the virtual carpet will produce this substantially linear response or representation. Consequently, during processing, the current virtual frame number VFNc, may be mapped to point 806 along the linear approximation, which can then be correlated to the predicted current depth dc, during the processing (or correlated to the predicted deposition depth). The depth dc is further approximated to lie between depth d2 and d3, based on the linear approximation and the identified virtual frame number. The current depth dc, in one embodiment, can be identified using extrapolation from one or more previous predictions of the depth. In some embodiments, a target value may not be reached exactly a new frame. If the real-time processing required that a depth of d3 be reached, the system would continue to process the carpet for the current fabrication operations, and will continue to compare two or more frames or a patch of the currently being generated carpet of a wafer with the virtual carpet, upon fitting the current patch or frames to the virtual carpet. When a target value is achieved before the next frame, an endpoint time may be calculated by extrapolating predicted values from previous frames. As a result, real-time processing may be controlled with sub-frame accuracy.

Thus, the process can continue to check whether the current virtual frame number corresponds to the desired depth d3. Once the system processing the production wafer reaches VFN5, for example, a depth d3 will be reached, and the controller will instruct the etch process to stop.

Figure 9:
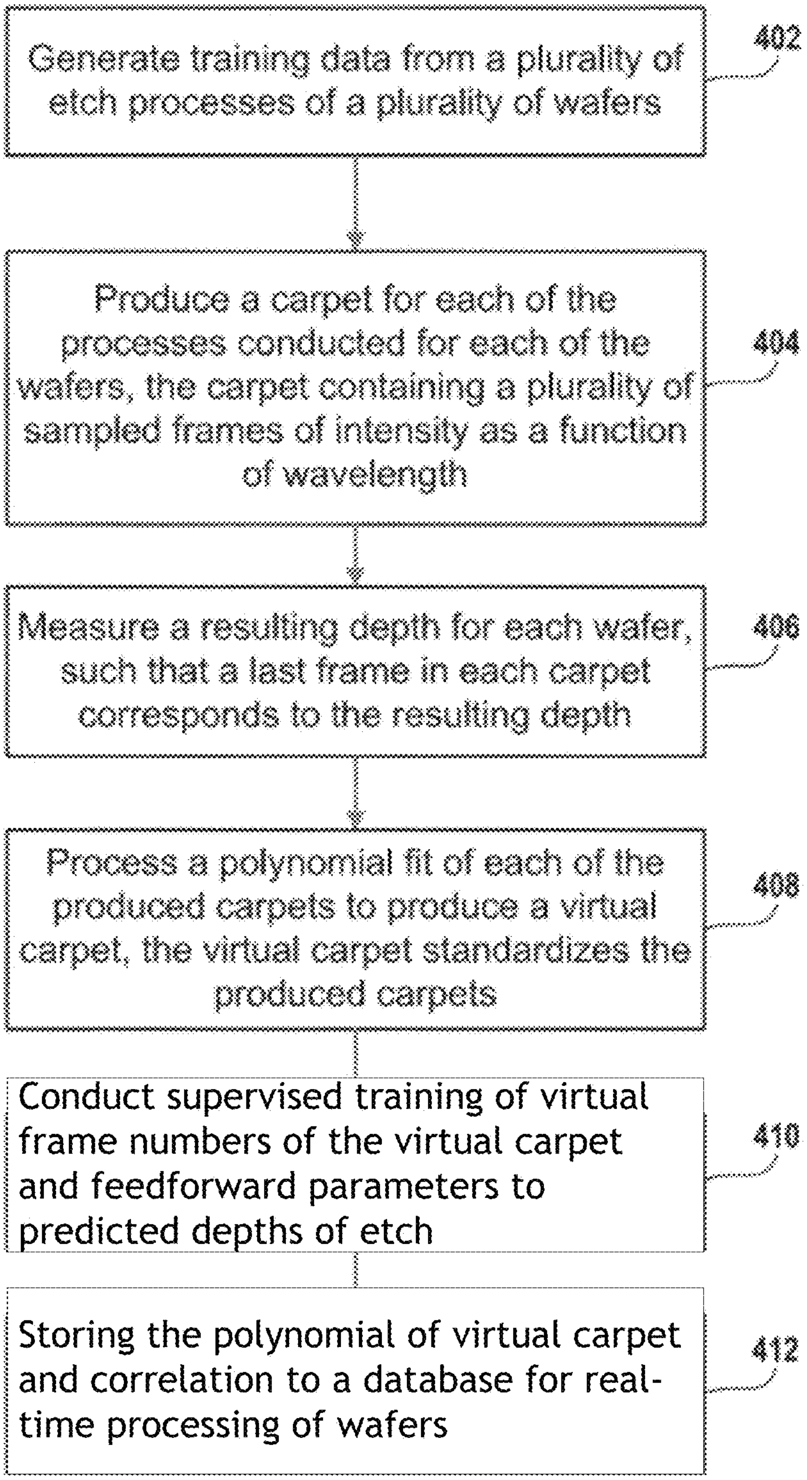
FIG. 9 illustrates an example process of generating training data from a plurality of wafers, to produce a plurality of carpets that are then fitted to a virtual carpet, in accordance with one embodiment.

FIG. 9 illustrates an example process of generating training data from a plurality of wafers, to produce a plurality of carpets that are then fitted to a virtual carpet (machine learning model), in accordance with one embodiment. While FIG. 9 is presented in the context of etching operations, it should be understood that FIG. 9 applies equally to deposition and other fabrication operations, including multi-step operations such as ALD and ALE. In operation 402, training data is generated from a plurality of etch processes of a plurality of wafers. As mentioned above, the same etch system or various etch systems configured similarly, can process a number of wafers, and during the processing, intensity as a function of wavelength can be captured. In operation 404, a carpet for each of the processes conducted for each of the wafers is produced.

The carpet will contain a plurality of sampled frames of intensity as a function of wavelength. When the process etching is complete for the training wafer, operation 406 will measure a resulting depth for each wafer, such that a last frame in each carpet will correspond to the resulting depth that was measured. In one example, a metrology system may be used to conduct the measurements. In operation 408, a polynomial fit is processed for each of the produced carpets to produce a virtual carpet (machine learning model). Some of the polynomial coefficients of the virtual carpet might be floating and others are fixed or coupled to the floating parameters so that all the polynomials of the respective coefficients of each of the plurality of carpets are a subset of those of a virtual carpet. The virtual carpet is therefore a superset of the plurality of carpets produced during processing of wafers during training. In operation 410, a correlation is generated between virtual frame numbers of the virtual carpet and measurement to predicted depths of etch. This includes conducting supervised training of virtual frame numbers of the virtual carpet to depths of etch or a metric. Optionally, operation 410 correlates wafer parameter information (e.g., etch depth) with not only information from virtual carpets but other information about process conditions such as temperatures, pressures, gas flow rates, plasma conditions, chamber component configurations, etc. These other features are sometimes referred to as feed forward parameters.

By way of example, the correlation is shown in FIG. 8, by way of the mapping chart 800. In operation 412, the virtual carpet and the correlation is stored to a database for use during real-time processing of wafers. In some embodiments, the virtual carpet and the correlation is stored as a binary model for use during real-time processing of wafers.

Figure 10:
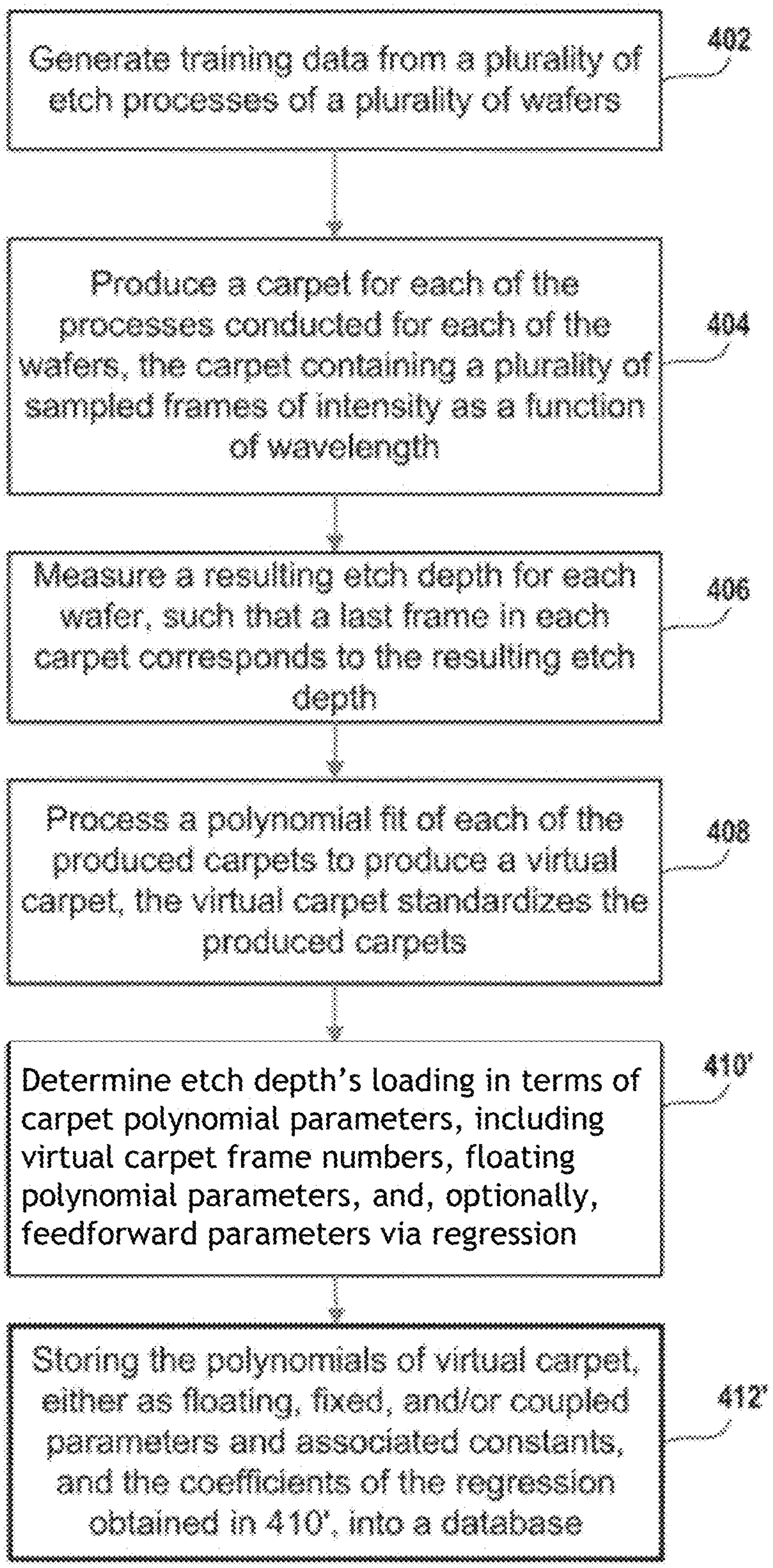
FIG. 10 illustrates another example process of generating training data from a plurality of wafers, to produce a plurality of carpets that are then fitted to a virtual carpet, in accordance with one embodiment.

FIG. 10 is another example of the process of FIG. 9, with additional detail provided in regard to operations 410 and 412. In this example, operation 410' describes that etch depth's loading can be defined in terms of carpet polynomial parameters (and optionally one or more feed forward parameters). Carpet parameters may include virtual carpet frame numbers and other floating polynomial parameters of the carpet. In operation 412', the polynomials of virtual carpet (and optionally one or more feed forward parameters) are stored. The polynomials can be stored in a database as either as floating, fixed, and/or coupled parameters and associated constants. In this example, the coefficients of the regression (and optionally one or more feed forward parameters) are obtained in 410'.

As used herein, real-time processing of wafers means that production wafers are being processed, and the endpoint mechanisms utilized implement the use of fitting produced carpet patches to a virtual carpet, that was generated during a prior training operation. In some embodiments, the controller of the chamber can process the correlation of the carpet being generated to the virtual carpet. In other implementations, a separate computer or even a network computer can access the virtual carpet and produce the results from the comparison, the fitting operations, and the resulting endpoint determinations.

In further embodiments, the process can be shared by one or more computers or one or more processes, in the form of real computers or virtualized computers. In some embodiments, the processing can be distributed among a plurality of virtual machines. In either manner, the processing of fabrication wafers can implement a virtual carpet (machine learning model), such that carpets being produced during fabrication can be compared to the virtual carpet in order to determine endpoint or verify a metric associated with the etching process. As mentioned above, measurements can be made of etch depths. However, measurements can be made of any number of feature metrics, such as wafer characteristics, critical dimensions, wafer bow, and the like.

Figure 11:
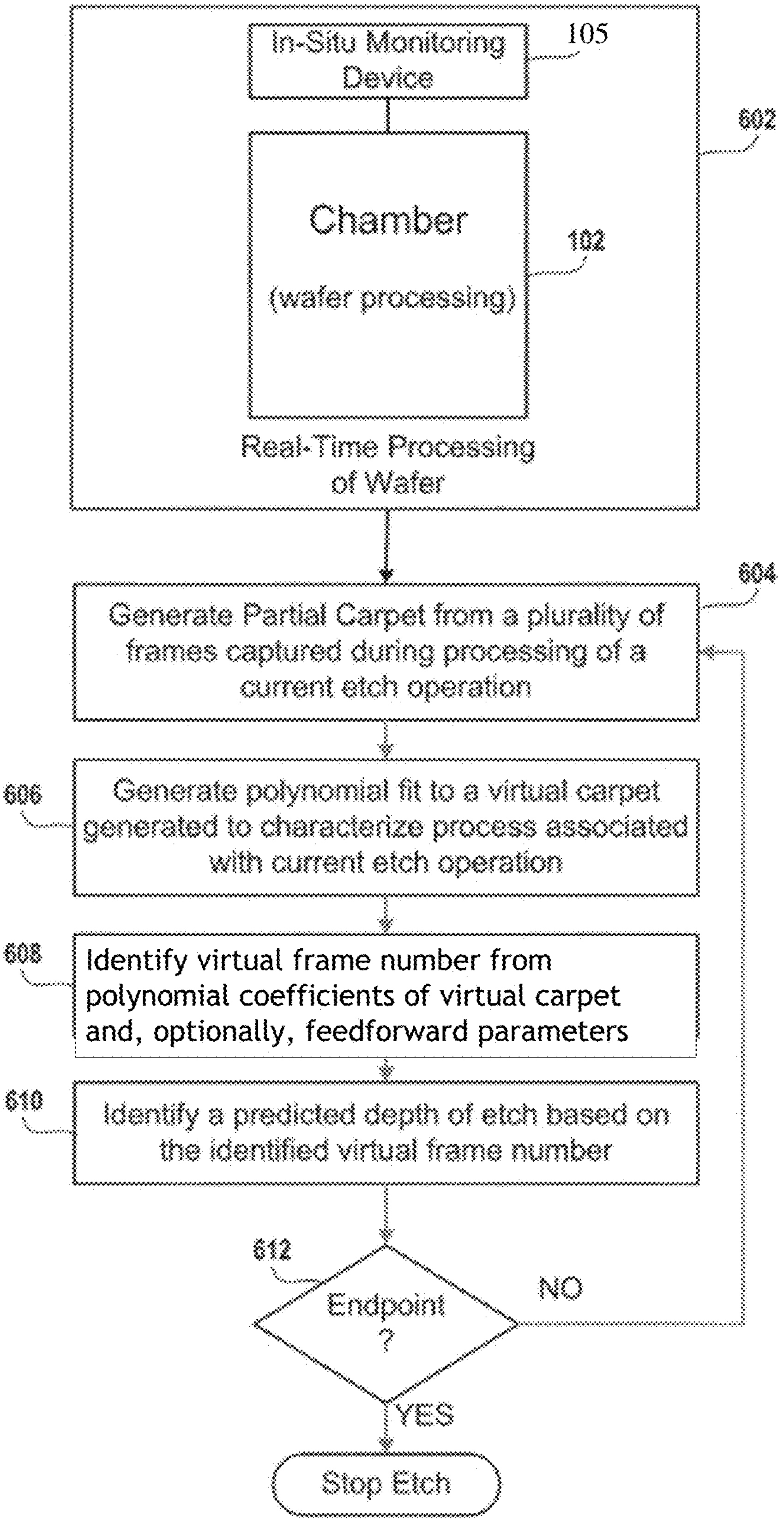
FIG. 11 illustrates an example process where real-time processing of a wafer is being conducted in operation, in accordance with one embodiment.

FIG. 11 illustrates an example process where real-time processing of a wafer is being conducted in operation 602, in accordance with one embodiment. As shown, the real-time wafer processing may be performed by a fabrication chamber, such as chamber 102, that is coupled to or connected to an in situ monitoring device 105 (such as sensors 136 and/or reflectometer 200 of FIG. 1). In some embodiments, the chamber 102 may be installed in a fabrication facility, along with many other chambers. Each of the chambers can themselves be connected to the in situ monitoring device 105, such that spectral data can be collected for a plurality of frames over a time series.

In operation 604, a partial carpet is generated from the plurality of frames captured during processing of a current etch operation. As mentioned above, during fabrication processing, a carpet is continuously being produced, by adding more and more frames at predefined sampling rates, to define the current carpet. At periodic points in time, which can be programmatically set, the controller of the system or a separate process, can trigger that a polynomial fit of the partial carpet be made to the virtual carpet (i.e., the virtual carpet having been previously generated during training) to characterize the process associated with the current etch operation, as per operation 606. In operation 608, a virtual frame number and carpet polynomial coefficients are identified from data associated with the virtual carpet. In operation 608, one or more feedforward parameters (e.g., equipment component details, pressure, temperature, plasma parameters, etc.) are also identified.

In operation 610, a predicted depth of etch is identified based on the identified virtual frame number, as shown with reference to the example of FIG. 8. In one embodiment, the prediction of the etch depth will use the virtual frame number as well as other carpet polynomial coefficients. By way of example, at least part of the prediction comes from the virtual frame number, but the polynomial coefficients floated in the run-time process captures the differences of the partial carpets and provides a correction (via the predetermined loading parameters) to the prediction. In operation 612, it is determined whether the endpoint will be reached in the next frame by extrapolating predicted metrics from previous frames. If the endpoint will not be reached in the next frame, the system will continue to process another portion of the partial carpet, which includes the last or most currently processed frame, and will proceed through operation 606, 608, and 610. If the endpoint will be reached in the next frame, the etch operation will be stopped at the predicted endpoint time. Once the process endpoint has been reached, meaning that the desired etch depth has been reached and corresponds to the predicted depth etch in operation 610, the etch operation will be stopped.

Although specific examples were provided regarding the generation of carpets using measured broadband in situ reflectometry spectra, still other methods of measuring can be used. Further, laser methods like laser absorption spectrometry may be used. In one example, laser absorption with a carpet on integration band or laser absorption spectroscopy with full spectra, may be used. In still other embodiments, RF signals which also have frequency spectra that are known to display similar complicated carpet behaviors related to both on-wafer metric changes, chamber parts, plasma impedance (chemistry) changes, may also be amenable to the analyses disclosed. In regard to RF signals, it is believed that metrics obtained will be less about endpoint and more about or useful for chamber matching/metrification.

In some embodiments, the spectral data that is collects is associated with light or laser interferometry, or reflectometry and absorption, or OES, or RF voltage and current traces themselves or mathematically transformed into RF spectral amplitude. In one embodiment, the spectral data is collected from a chamber used for etching while a feature is being etched on a wafer.

In still other embodiments, more data streams can be put together to make synthetic 'spectra' that have carpet-like behaviors. One usefulness of using a carpet, as described herein, is the physically constrained strong correlation and continuity relationships between any spectral element and its near-spectral-dimension neighbor and its near-temporal-dimension neighbors. If different tool data is used in conjunction with the spectra collected, the law-of-nature-enforced continuity of correlation in 'spectral' and 'temporal' space may be reduced. This is because the tool-data variables are not necessarily 'near' each other due to physics. In one embodiment, it is possible to sort the tool data to either find the physics to put tool-data variables 'next to' each other. In some embodiments, the variables may be mathematically selected and ordered 'by discovery' for a 'good operating tool' such that the variables are arranged in a 'pseudo-spectra' known to have 'spectro-temporal' correlation and continuity.

In this manner, it is possible to use carpet processing to call control actions and detect differences between tools. In one embodiment, the controller 124, described with reference to FIG. 1 above may include a processor, memory, software logic, hardware logic and input and output subsystems from communicating with, monitoring and controlling a plasma processing system. In various embodiments, the processes shown in FIGS. 9, 10, and 11 can be performed by controller 124. The controller 124 may also handle processing of one or more recipes including multiple set points for various operating parameters (e.g., voltage, current, frequency, pressure, flow rate, power, temperature, etc.), e.g., for operating a plasma processing system. Furthermore, although more detailed examples were provided with reference to etching operations (e.g., etching tools), it should be understood that the operations can equally be utilized for deposition operations (e.g., deposition tools). For example, in the verification operations, instead of verifying etch performance, the verification can be of deposition performance. Deposition performance can be quantified in various ways, and without limitation, various types of metrology methods and/or tools may be used. Furthermore, deposition performance may be measured, sensed, approximated, and/or tested in-situ or off-line.

In some implementations, a controller 124 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 124, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 124 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 124 in the form of various individual settings (or program files), defining operational parameters for carrying out a particular process on or for a semiconductor wafer or to a system. The operational parameters may, in some embodiments, be part of a recipe defined by a process that is engineered to accomplish one or more processing steps during the fabrication of one or more layers, materials, metals, oxides, silicon, silicon dioxide, surfaces, circuits, and/or dies of a wafer.

The controller 124, in some implementations, may be a part of or coupled to a computer that is integrated with, coupled to the system, otherwise networked to the system, or a combination thereof. For example, the controller 124 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer.

In some examples, the controller 124 receives instructions in the form of data, which specify parameters for each of the processing steps to be performed during one or more operations. It should be understood that the parameters may be specific to the type of process to be performed and the type of tool that the controller 124 is configured to interface with or control. Thus as described above, the controller 124 may be distributed, such as by comprising one or more discrete controllers 124 that are networked together and working towards a common purpose, such as the processes and controls described herein. An example of a distributed controller 124 for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 124 might communicate with one or more of other tool circuits or modules, other tool components, cluster tools, other tool interfaces, adjacent tools, neighboring tools, tools located throughout a factory, a main computer, another controller 124, or tools used in material transport that bring containers of wafers to and from tool locations and/or load ports in a semiconductor manufacturing factory.

In Situ Metrology

In some workflows, data captured by sensors during an electronic device fabrication process is used to infer a wafer structure parameter value at one or more stages of a multi-step process. These results or inferences may be referred to as in situ metrology values. The inferred in situ metrology values may be made available to a separate system, which may use the information to make process control decisions about adjusting the process control values at any one or more steps of the multistep process. In some embodiments, a process control system is controlled by an entity responsible for operating an IC fabrication facility or for producing a particular IC or other electronic device. The process control decisions made by such entity is sometimes implemented as Advanced Process Control (APC).

The process control using in situ metrology values may be implemented using a run-to-run or "R2R" concept. In general, R2R control involves modifying or selecting recipe or control parameters between runs in a fabrication tool. The goal is to improve processing performance in some manner such as by improving uniformity or meeting device/manufacturing specifications.

A run can be a batch, lot, or an individual wafer. In certain embodiments, R2R control uses in situ metrology, optionally along with process, equipment, and metrology data. In some cases, R2R control uses historical knowledge of wafer features or other parameters to suggest changes to the recipe or other setting after each run. One use of R2R is to capture and correct process shifts and drifts and to reduce process variability between runs. Some benefits include improved process capability (increased accuracy to target and reduced variability), early detection of process drifts, reduced process downtime, better process control, and scrap reduction. R2R control may utilize either or both feedforward and feedback information. This information may come from pre and post-process metrology, respectively. Unfortunately, because most metrology, and particularly nanometer-scale metrology, is so costly, relatively few wafers are measured. Therefore, a controller must operate without sampling many wafers, thereby limiting controller effectiveness. In situ metrology, as described here, can enable essentially 100% sampling during processing.

In certain embodiments, the in situ metrology values are determined and output by a machine learning model. Such machine learning model generates the in situ metrology values from sensed information collected in situ, while a wafer or wafers is being processed in a fabrication tool. The sensed information may be time varying, spectral data or parameters extracted therefrom, such as a carpet described elsewhere herein.

The in situ metrology values output by a machine learning model may represent structure parameter values of features on the wafer at any one or more steps of a multistep process. As mentioned elsewhere in this disclosure, some wafer structure parameters represent geometric properties of features. Examples include feature depth, width, sidewall angle, overlay, as well as parameters characterizing repeating structures such as critical dimension and pitch. And as mentioned, some wafer structure parameters represent physical properties of structures on a wafer. Examples include the thickness of one or more layers on a wafer and dispersive properties such as refractive index and extinction coefficient of one or more layers on a wafer.

Note that in situ metrology values can be obtained for any one or more steps of a multi-step process. However, not all processes or systems need be configured to obtain all in situ metrology values for all steps, even if there is a causal relationship between a parameter of interest (e.g., CD of features at the end of a multi-step etch process) and all of the steps in the process. This may be appropriate for some multi-step processes in which only one or a few steps have a significant impact on a wafer parameter of interest (e.g., total etch depth). For this reason, an in situ metrology system may be configured to provide wafer parameter values for only one or a few steps. For example, if step C of a four-step process has the most significant impact on the overall process, it may be unnecessary to obtain in situ metrology values for steps A, B, and/or D. In other example, it may be useful to obtain in situ metrology values for step D, the last step, as the final features are likely to be pronounced.

Note that the in situ metrology values reflect the condition of a wafer, wafer features, or environment where fabrication occurs while the wafer is being processed. They may serve as an intermediate result that can be used for any other purpose. In other words, in situ metrology results may be generated without regard to process control or any particular application. In some embodiments, a first system or method produces in situ metrology values, and a separate system or method interprets or otherwise uses those values for any of various purposes such as to adjust process conditions (feedback or feedforward), determine a new recipe, and/or modify an apparatus setting such as a firmware or software setting for a plasma source, pedestal heater, or other component. In some cases, the first system is integrated or bundled with a fabrication tool, while the second system is controlled by an IC fabrication facility or the entity responsible for producing integrated circuits or other electronic devices. As indicated, the first system may be implemented as a machine learning model designed or configured to receive in situ collected, time varying spectral data or parameters extracted therefrom.

Figure 13:
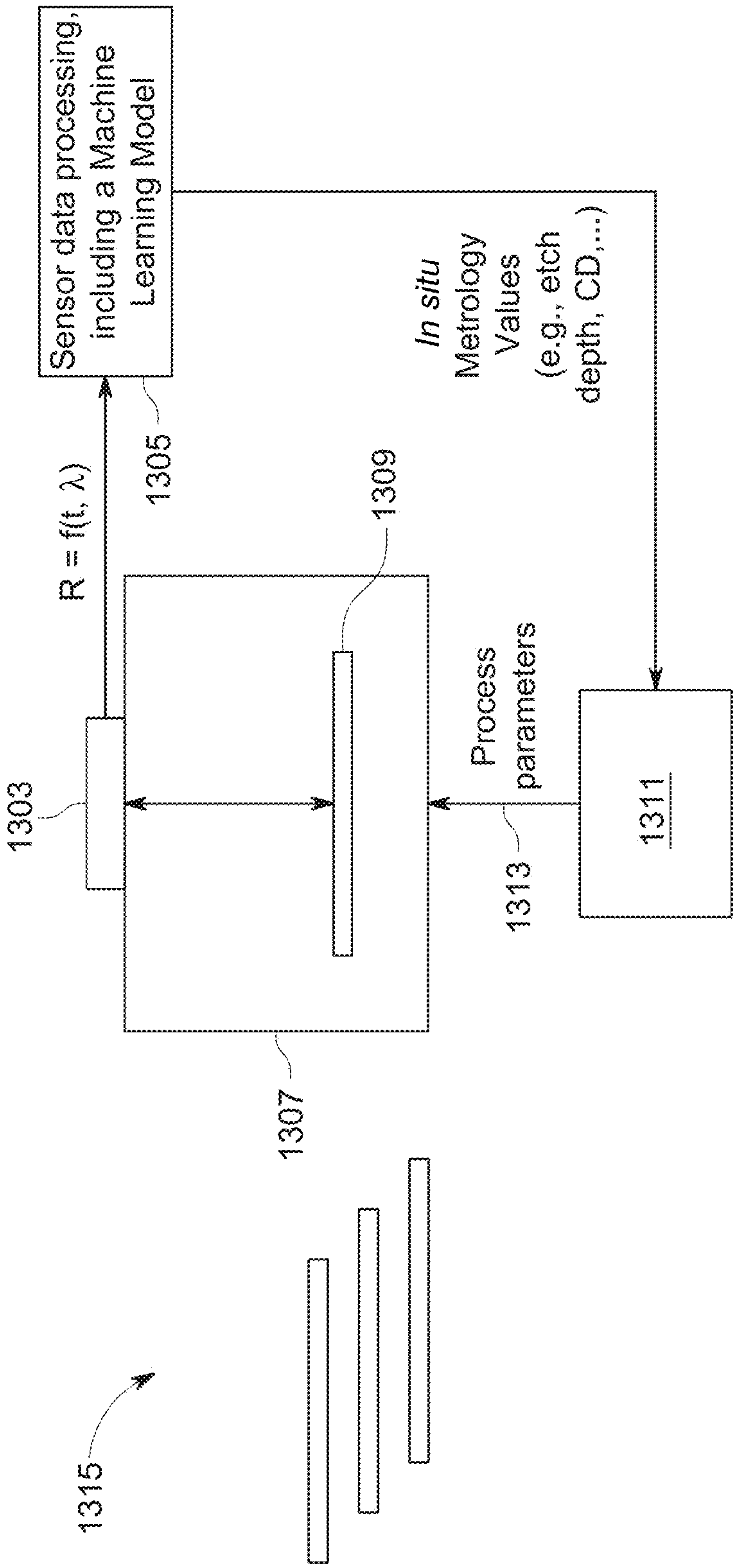
FIG. 13 is a schematic diagram of a system that may generate and use in situ metrology values.

FIG. 13 depicts a workflow in which one or more sensors 1303 are configured to collect in situ, time varying, spectral data from a process chamber 1307 and/or one or more wafers 1309 undergoing processing in the process chamber. An associated machine learning model 1305 is configured to accept the in situ, time varying, spectral data and generate inferred in situ metrology values. A separate system, team, and/or individual 1311 may receive the inferred in situ metrology values and use them for a dedicated purpose such as adjusting process conditions in a feedback or feed forward manner. See data path 1313 for providing control instructions. FIG. 13 shows preprocessed wafers 1315 waiting to be processed in chamber 1307. Wafers 1315 may be processed after or during application of updated process control instructions to chamber 1307. System, team, and/or individual 1311 may operate independently of machine learning model 1305. For example, machine learning model 1305 may be dedicated to the process chamber 1307 and/or provided by a vendor of chamber 1307, while system, team, and/or individual 1311 may be maintained or under control of an IC fabrication facility or entity responsible for producing integrated circuits.

In certain embodiments, a machine learning model and optional associated computational module(s) for generating in situ metrology values is configured to perform one or more of the following operations: feature extraction from in situ time varying, spectral data, application of previously selected hyperparameters for analyzing features extracted from the in situ data, and inference of in situ metrology values from the extracted features. Feature extraction may reduce the dimensionality of the of the in situ, time varying, spectral data. This can facilitate computation of in situ metrology values when in situ data is collected over long periods, over multiple steps of a multi-step process, from multiple sensors, and/or over a wide range of wavelengths. Various techniques may be employed for feature extraction. As mentioned, such techniques include fitting the time varying, spectral data to a polynomial. Other techniques include fast-Fourier transform, wavelet method, and principal component analysis.

A machine learning model for generating in situ metrology values may employ any one or more hyperparameters. Examples of such hyperparameters include start and end times of the time varying data, wavelength boundaries of the spectral data, the order of a polynomial used in feature extraction, etc.

As mentioned, the in situ metrology values may be produced by a machine learning model. A suitable machine learning model may take any of various forms. Examples include a regularized linear model, support vector machine, decision tree, random forest model, gradient boosted tree, neural network, autoencoder, and any combination thereof. In some cases, a machine learning model works in concert with one or more other computational modules to perform operations that support the inferencing conducted by the machine learning model. Such other module(s) may be configured to, for example, pre-process in situ, time varying, spectral data prior to providing the data to the machine learning model. Examples of operations that may be performed by such module(s) include extraction of features from in situ, time varying, spectral data and application of hyperparameters to, e.g., divide or partition the in situ data. In some implementations, a single machine learning model is configured to provide in situ metrology values for each of multiple steps of a multi-step process. However, in some cases, different machine learning models may be employed to generate in situ metrology values for different steps of a multi-step process. In some implementations, a single machine learning model is configured to provide multiple different types of in situ metrology values for a given step or steps (e.g., CD, etch depth, sidewall angle). In other implementations, separate machine learning models are employed to provide separate types of in situ metrology values.

In accordance with certain embodiments, process conditions are adjusted for future wafers by evaluating a sample wafer using in situ metrology and an associated machine learning model, which is built using many prior wafers. This approach may reduce the time between acquiring metrology data and adjusting process conditions for subsequent wafers.

When using in situ metrology for process control (e.g., to determine a process setting adjustment), the resulting adjustment may be applied to (a) the process apparatus from which the in situ metrology values were obtained (for a current and/or subsequent wafers), (b) a downstream process apparatus (for a current and/or subsequent wafers), and/or (c) an upstream process apparatus (for subsequent wafers or a reference for another piece of fabrication equipment that employs the same process). Thus, the in situ metrology values may be employed for feedback and/or feed forward process control. In certain embodiments, the in situ metrology values are used to determine adjustments to process conditions or settings for future wafers, i.e., wafers that have not yet been processed in the process chamber where the in situ metrology values are acquired, at the time when the in situ metrology values are acquired. In some cases, future wafers subject to processing under adjusted conditions are in the same lot as the wafer(s) from which the in situ metrology values were acquired. In some cases, the future wafers are from a different lot. In some cases, the future wafers are from a group of wafers used to fabricate one or more different semiconductor products, with some of these future wafers having different patterns (from one used to acquire the in situ metrology values).

In general, process control may be implemented automatically at the equipment level (e.g., by a recipe or pre-coded feedback or feedforward process control) or at the fabrication facility level (e.g., by a system or operator making decisions based on in situ metrology values). Conditions set at the facility level may override recipes or other process settings provided with the equipment.

As explained, generating in situ metrology values may involve capturing a spectral time series of sensor values for each of multiple steps in the multistep process. It may involve capturing this information from one or multiple sensors. In other words, an in situ metrology system may be configured for pervasive sensor capture and feature extraction for multiple process steps and possibly using multiple sensors. By capturing all available in situ data, the in situ metrology system has the flexibility to utilize data from any one or more sensors during any one or more steps of a multi step process.

Acquiring in situ data across each of many steps and optionally each of multiple sensors allows maximum flexibility for determining any one or more wafer level feature characteristics for any one or more process steps in a multistep process. However, processing all this sensed data can be unnecessarily computationally expensive. If it turns out that only a small subset of features such as the critical dimension and etch depth are important, and these are important in only one or two steps such as steps A and D out of steps A-E, then the machine learning model need only operate on a subset of the in situ data. For example, the model may require only the data acquired for steps A and D and, as well, only data needed to determine the particular metrology values under consideration (e.g., critical dimension and etch depth in features A and D).

Regardless of which data is employed (from which sensor(s) and/or from which steps) during the inference phase, all sensed data may be subject to the same general feature extraction and/or dimensionality reduction process before extracted features are input to a machine learning model. Additionally, the same hyperparameters may be employed for each step and/or each feature type. Hyperparameters may be determined through optimization for individual machine learning models. In certain embodiments, different feature extraction techniques are used in different steps. This may enable use of different machine learning models, which may be dedicated to or customized for different steps and/or different wafer features types.

Acquisition of in situ data across multiple steps and optionally multiple sensors may apply to both the learning phase and the inference phase. Once a machine learning model is created through training, and is deployed, it uses in situ sensor data captured from production wafers, which sensor data has been subject to the same feature extraction and/or dimensionality reduction processing.

The machine learning model may be trained using metrology data as labels or references for supervised or semi-supervised learning. The reference metrology data may be from any of various sources of training data including physical metrology data from a plurality of training substrates, as well as, in some embodiments, virtual metrology data. Physical metrology may be conventional metrology such as reflectometry metrology performed on post-processed wafers. Reference metrology includes optical metrology (reflectometry, ellipsometry), TEM, SEM etc. Virtual metrology data may be determined from indirect information such as emission spectra in a chamber where a substrate is being processed.

In some situations, the amount of data available is limited based on, for example, requirements of a fabrication facility. For example, some training data must be obtained from wafers produced using special process conditions that are not used to fabricate production wafers. Using production equipment to generate training data is a significant cost to the fabrication facility. As a result, a fabrication facility may be willing to dedicate only a few wafers, e.g., about ten or fifteen wafers, to generating data for training.

Conventionally, training wafers are prepared using a combination of process variations over a wide range to establish causal relationship via training or machine learning. These wafers may be referred to as design-of-experiment wafers. For example, if there are five steps in a process and each step may be executed using a range of process conditions (to produce a range of process parameter values such as multiple values of critical dimension, multiple values of feature depth, multiple values of sidewall angle, etc.), a vast number of possible data points are required to exhaustively define the metrology space needed to train an appropriate in situ metrology model. Through appropriate choice of these combinations of parameters, relevant data for training can be generated using only relatively few wafers.

A DOE methodology may employ understanding about the dependencies between independent variables (e.g., process chamber pressure) and dependent variables (e.g., feature CD) in the process space. The sensitivity of some dependent variables to particular independent variables may inform the choice of which data points to collect for generating a training set. For example, if a metrology value such as etch depth is very sensitive to changes in wafer temperature, experiments may be conducted at least two temperatures.

In some cases, the dependencies between different variables and/or the sensitivity of some variables to other variables may be represented using a graph structure such as a directed-acyclic-graph (DAG). In some embodiments, a DAG is used to describe the dependence of final metrology metrics (e.g., etch depth at the end of a multi-step etch process) to information about a step in the process and optionally about variations in incoming wafers. A set of training experiments may be prescribed based on dependencies and sensitivities as illustrated in a DAG.

During development of an in situ metrology method or algorithm, an iterative approach may be employed to determine details of both the feature extraction process and the machine learning process. The regularization procedures employed during some machine learning procedures may assist in determining aspects of the feature extraction process. Further, methods to evaluate data feature importance can be deployed to identify the key dimensions to capture from in situ sensor data at each step. Some such methods rely on filters that specify some metric for removing some dimensions. An example of such a metric could be correlation/chi-square. Another type of method for evaluating data feature importance is the wrapper-based methods that may consider the selection of a set of features as a search problem. One example of a wrapper method is recursive feature elimination. Yet another type of method for evaluating data feature importance is the embedded methods having built-in feature selection methods. Examples include Lasso and Random Forest, which have their own feature selection methods.

Because in situ metrology values are generated for each wafer during production, without impacting throughput, the resulting information and its use comes at little cost. And the in situ metrology values can be used for many aspects of semiconductor device process control. The resulting metrology values may be used for various purposes including feedforward adjustment, feedback adjustment, warning signals to stop the fabrication tool, to trigger more detailed metrology sampling actions for further investigation, and the like. And the metrology values may be used at run time, e.g., at the end or at an intermediate stage of a multistep process.

Control Module

Figure 12:
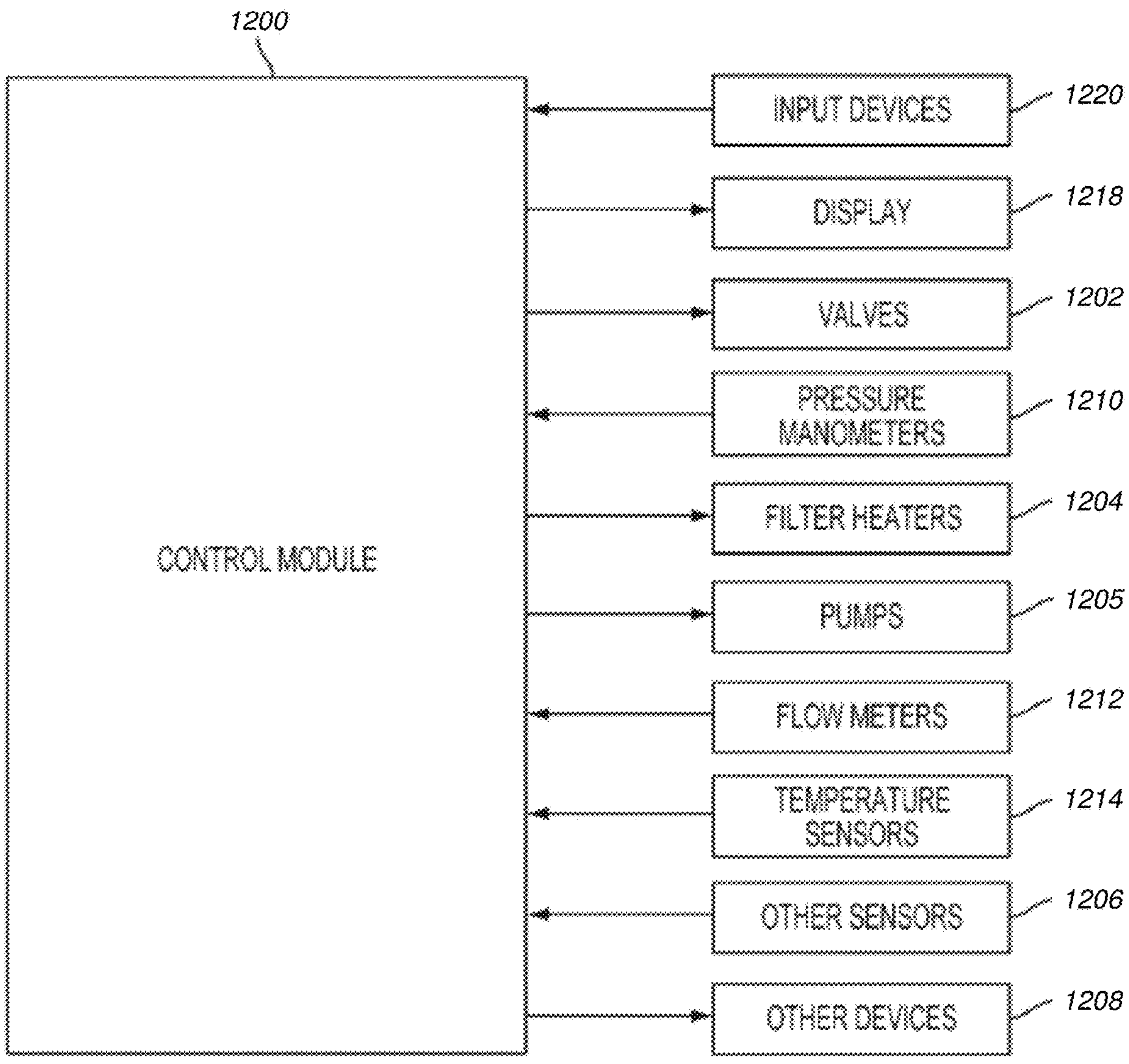
FIG. 12 is a schematic diagram of an example control module for controlling substrate processing systems in accordance with certain disclosed embodiments.

FIG. 12 shows a control module 1200 for controlling the systems described above. In one embodiment, the control module 124 of FIG. 1 may include some of the example components. For instance, the control module 1200 may include a processor, memory and one or more interfaces. The control module 1200 may be employed to control devices in the system based in part on sensed values. For example only, the control module 1200 may control one or more of valves 1202, filter heaters 1204, pumps 1205, and other devices 1208 based on the sensed values and other control parameters. The control module 1200 receives the sensed values from, for example only, pressure manometers 1210, flow meters 1212, temperature sensors 1214, and/or other sensors 1206. The control module 1200 may also be employed to control process conditions during precursor delivery and deposition of the film. The control module 1200 will typically include one or more memory devices and one or more processors.

The control module 1200 may control activities of the precursor delivery system and deposition apparatus. The control module 1200 executes computer programs including sets of instructions for controlling process timing, delivery system temperature, pressure differentials across the filters, valve positions, mixture of gases, chamber pressure, chamber temperature, wafer temperature, RF power levels, wafer chuck or pedestal position, and other parameters of a particular process. The control module 1200 may also monitor the pressure differential and automatically switch vapor precursor delivery from one or more paths to one or more other paths. Other computer programs stored on memory devices associated with the control module 1200 may be employed in some embodiments. As examples and in various embodiments, the processes shown in FIGS. 9, 10, and 11 can be performed by control module 1200.

Typically there will be a user interface associated with the control module 1200. The user interface may include a display 1218 (e.g., a display screen and/or graphical software displays of the apparatus and/or process conditions), and user input devices 1220 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck.

Examples of sensors that may be monitored during deposition include, but are not limited to, mass flow control modules, pressure sensors such as the pressure manometers 1210, and thermocouples located in delivery system, the pedestal or chuck (e.g. the temperature sensors 1214). Appropriately programmed feedback and control algorithms may be used with data from these sensors to maintain desired process conditions. The foregoing describes implementation of embodiments of the invention in a single or multi-chamber semiconductor processing tool.

In some embodiments, the plasma may be monitored in situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

Any suitable chamber may be used to implement the disclosed embodiments. Example deposition apparatuses include, but are not limited to, apparatus from the ALTUS® product family, the VECTOR® product family, and/or the SPEED® product family, each available from Lam Research Corp., of Fremont, California, or any of a variety of other commercially available processing systems. Two or more of the stations may perform the same functions. Similarly, two or more stations may perform different functions. Each station can be designed/configured to perform a particular function/method as desired.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface. Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the deposition processes (and other processes, in some cases) in accordance with the disclosed embodiments. Examples of programs or sections of programs for this purpose include substrate positioning code, process gas control code, pressure control code, and heater control code.

In some implementations, a controller is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Additional Considerations

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 or 300 mm, though the industry is moving toward adoption of 450 mm diameter substrates. The description herein uses the terms "front" and "back" to describe the different sides of a wafer substrate. It is understood that the front side is where most deposition and processing occurs, and where the semiconductor devices themselves are fabricated. The back side is the opposite side of the wafer, which typically experiences minimal or no processing during fabrication.

The flow rates and power levels provided herein are appropriate for processing on 300 mm substrate, unless otherwise specified. One of ordinary skill in the art would appreciate that these flows and power levels may be adjusted as necessary for substrates of other sizes. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of generating a machine learning model configured to predict a substrate parameter value on a substrate during or after processing the substrate in a process chamber, the method comprising:

receiving training data comprising, for each of a plurality of training substrates, (a) spectral data collected at a plurality of time points in situ from a training substrate over multiple steps of a multi-step etch process or a multi-step deposition process performed on the training substrate, wherein the multi-step etch process or the multi-step deposition process included: 1) at least two non-contiguous etching steps or at least two non-contiguous deposition steps; or 2) at least two contiguous etching steps or at least two contiguous deposition steps performed on the training substrate, and (b) a parameter value characterizing at least one physical property of the training substrate, wherein the physical property was modified by the multi-step etch process or by the multi-step deposition process;

extracting features from the spectral data to provide a separate virtual representation of the spectral data for each of the training substrates; and generating the machine learning model by using, for each of the plurality of training substrates, the separate virtual representation of the spectral data and the parameter value characterizing at least one physical property of the training substrate, wherein the machine learning model is configured to predict the substrate parameter value of a test substrate subjected to the multi-step etch process or the multi-step deposition process using, as inputs, spectral data collected in situ from the test substrate.

2. The method of claim 1, further comprising:

based on the machine learning model and the spectral data collected in situ from the test substrate, changing a duration of an intermediate step of the multi-step etch process or the multi-step deposition process.

3. The method of claim 1, wherein the spectral data comprises at least two types of spectra collected in situ from the training substrates.

4. The method of claim 1, wherein the spectral data comprises reflectance spectra collected in situ from the training substrates.

5. The method of claim 1, wherein the spectral data comprises emission spectra collected in situ from the training substrates.

6. The method of claim 1, wherein extracting features from the spectral data comprises fitting the spectral data with a polynomial.

7. The method of claim 1, wherein the multi-step etch process or the multi-step deposition process is an atomic layer etch process.

8. The method of claim 1, wherein the multi-step etch process or the multi-step deposition process is a plasma etching process having at least two non-contiguous etching steps.

9. The method of claim 1, wherein the parameter value characterizing at least one physical property of the training substrate is an etch depth or a deposition depth.

10. The method of claim 1, wherein the parameter value characterizing at least one physical property of the training substrate is a critical dimension.

11. The method of claim 1, wherein the parameter value characterizing at least one physical property of the training substrate is a sidewall angle.

12. The method of claim 1, wherein the parameter value characterizing at least one physical property of the training substrate is an overlay.

13. The method of claim 1, wherein the parameter value characterizing at least one physical property of the training substrate is a critical dimension of recessed features on the substrate.

14. The method of claim 1, wherein receiving the training data comprises, for each training substrate of the plurality of training substrates, receiving a plurality of parameter values characterizing a plurality of physical properties of the training substrate, wherein generating the machine learning model comprises using, for each of the plurality of training substrates, the plurality of parameter values characterizing the plurality of physical properties of the training substrate, and wherein the machine learning model is configured to predict the plurality of parameter values of the test substrate subjected to the multi-step etch process or the multi-step deposition process.

15. The method of claim 1, wherein the training data further comprises, for each of the plurality of training substrates, at least one feed forward parameter of a process chamber, and wherein generating the machine learning model uses the at least one feed forward parameter.

16. The method of claim 15, wherein the at least one feed forward parameter is selected from the group consisting of a temperature in the process chamber, a plasma condition in the process chamber, a pressure in the process chamber, a flow rate in the process chamber, a time duration of one or more process steps, and a design and/or configuration of a component in the process chamber.

17. The method of claim 15, wherein the at least one feed forward parameter is selected from the group consisting of a parameter from (a) a current step of the multi-step etch process or the multi-step deposition process, (b) a previous step prior to the current step of the multi-step etch process or the multi-step deposition process, or (c) a subsequent condition after completion of the current step of the multi-step etch process or the multi-step deposition process.

18. A method of controlling a multi-step etch process or a multi-step deposition process conducted on a substrate, the method comprising:

(a) receiving spectral data collected in situ, while material is deposited onto or etched from the substrate over multiple steps of the multi-step deposition process or over multiple steps of the multi-step etch process conducted in a process chamber;

(b) extracting features from the spectral data of the substrate to provide a virtual representation of the spectral data;

(c) processing the virtual representation using a machine learning model trained using virtual representations of a plurality of training substrates, each training substrate of the plurality of training substrates having undergone the multiple steps of the multi-step deposition process or the multi-step etch process, wherein the multi-step etch process or the multi-step deposition process included: 1) at least two non-contiguous etching steps or at least two non-contiguous deposition steps; or 2) at least two contiguous etching steps or at least two contiguous deposition steps performed on the training substrate; and (d) controlling and/or adjusting a process condition in the process chamber by using an output of the machine learning model.

19. The method of claim 18, wherein the controlling and/or adjusting the process condition comprises controlling or adjusting a length of time during a final step of the multi-step deposition process or of the multi-step etch process.

20. The method of claim 18, wherein the controlling and/or adjusting the process condition comprises controlling or adjusting a length of time during an intermediate step of the multi-step deposition process or of the multi-step etch process, the intermediate step preceding a final step of the multi-step deposition process or the multi-step etch process.

21. An apparatus, comprising:

a process chamber configured to hold a substrate and perform a multi-step etch process or a multi-step deposition process on the substrate;

at least one metrology module configured to generate spectral data at a plurality of time points in situ from the substrate over multiple steps of the multi-step etch process or the multi-step deposition process performed on the substrate; and a control system configured to:

(a) receive spectral data collected in situ using the at least one metrology module, while material is deposited onto the substrate over multiple steps of the multi-step deposition process or while material is removed from the substrate over multiple steps of the multi-step etch process;

(b) extract features from the spectral data of the substrate to provide a virtual representation of the spectral data;

(c) process the virtual representation using a machine learning model trained using virtual representations of a plurality of training substrates, each training substrate of the plurality of training substrates having undergone the multiple steps of the multi-step deposition process or the multi-step etch process, wherein the multi-step etch process or the multi-step deposition process included: 1) at least two non-contiguous etching steps or at least two non-contiguous deposition steps; or 2) at least two contiguous etching steps or at least two contiguous deposition steps performed on the training substrate; and (d) control and/or adjust a process condition associated with the multi-step etch process or the multi-step deposition process in the process chamber by using an output of the machine learning model.

22. The apparatus of claim 21, wherein the control system is configured to control or adjust a length of time during a final step of the multi-step deposition process or of the multi-step etch process.

23. The apparatus of claim 21, wherein the control system is configured to control and/or adjust a length of time during an intermediate step of the multi-step deposition process or of the multi-step etch process, the intermediate step preceding a final step of the multi-step deposition process or the multi-step etch process.

24. The apparatus of claim 21, wherein the control system is further configured to receive at least one feed forward parameter and process the at least one feed forward parameter, along with the virtual representation, using the machine learning model.

25. The apparatus of claim 24, wherein the at least one feed forward parameter is selected from the group consisting of a temperature in the process chamber, a plasma condition in the process chamber, a pressure in the process chamber, a flow rate in the process chamber, a time duration of one or more process steps, and a design and/or configuration of a component in the process chamber.

26. The apparatus of claim 24, wherein the at least one feed forward parameter is selected from the group consisting of a parameter from (a) a current step of the multi-step etch process or the multi-step deposition process, (b) a previous step prior to the current step of the multi-step etch process or the multi-step deposition process, or (c) a subsequent condition after completion of the current step of the multi-step etch process or the multi-step deposition process.

27. A method of performing metrology on a substrate undergoing a multi-step etch process or a multi-step deposition process, the method comprising:

(a) receiving spectral data collected in situ, while material is deposited onto or etched from the substrate over multiple steps of the multi-step deposition process or over multiple steps of the multi-step etch process conducted in a process chamber;

(b) extracting features from the spectral data of the substrate to provide a virtual representation of the spectral data;

(c) processing the virtual representation using a machine learning model trained using metrology data of a plurality of training substrates, each training substrate of the plurality of training substrates having undergone the multiple steps of the multi-step deposition process or the multi-step etch process, wherein the multi-step etch process or the multi-step deposition process included: 1) at least two non-contiguous etching steps or at least two non-contiguous deposition steps; or 2) at least two contiguous etching steps or at least two contiguous deposition steps performed on the training substrate; and (d) providing in situ metrology values of the substrate using an output of the machine learning model.

28. The method of claim 27, further comprising: based at least in part on the in situ metrology values, adjusting a process setting of the process chamber.

* * * * *